(12) United States Patent
Mori et al.

(10) Patent No.: US 10,659,709 B2
(45) Date of Patent: May 19, 2020

(54) SOLID-STATE IMAGING DEVICE, METHOD FOR DRIVING SOLID-STATE IMAGING DEVICE, AND ELECTRONIC APPARATUS

(71) Applicant: Brillnics Inc., Grand Cayman (KY)

(72) Inventors: Kazuya Mori, Tokyo (JP); Toshinori Otaka, Tokyo (JP); Isao Takayanagi, Tokyo (JP); Junichi Nakamura, Tokyo (JP); Naoto Yasuda, Tokyo (JP)

(73) Assignee: BRILLNICS INC., Grand Cayman (KY)

( * ) Notice: Subject to any disclaimer, the term of this patent is extended or adjusted under 35 U.S.C. 154(b) by 0 days.

(21) Appl. No.: 16/143,136

(22) Filed: Sep. 26, 2018

(65) Prior Publication Data

US 2019/0098242 A1    Mar. 28, 2019

(30) Foreign Application Priority Data

Sep. 26, 2017 (JP) ................. 2017-185502
Sep. 26, 2017 (JP) ................. 2017-185504

(51) Int. Cl.
*H04N 5/374* (2011.01)
*H04N 5/378* (2011.01)
(Continued)

(52) U.S. Cl.
CPC .......... *H04N 5/3742* (2013.01); *H03M 1/56* (2013.01); *H04N 5/341* (2013.01);
(Continued)

(58) Field of Classification Search
CPC .... H04N 5/378; H04N 5/35527; H04N 5/379; H04N 5/3591; H04N 5/37455;
(Continued)

(56) References Cited

U.S. PATENT DOCUMENTS 7,164,114 B2    1/2007   Lai et al.
8,553,122 B2   10/2013   Nitta et al.
(Continued)

FOREIGN PATENT DOCUMENTS

JP    2005-278135 A    10/2005
JP    2005-295346 A    10/2005

*Primary Examiner* — Gevell V Selby
(74) *Attorney, Agent, or Firm* — Westerman, Hattori, Daniels & Adrian, LLP

(57) ABSTRACT

An AD conversion part has a comparator for performing comparison processing comparing a voltage signal read out by a photoelectric converting and reading part and a reference voltage and outputting a digitalized comparison result signal, the comparator, under the control by a reading part, performs first comparison processing for outputting a digitalized first comparison result signal with respect to a voltage signal corresponding to an overflow charge overflowing from a photodiode PD1 to a floating diffusion FD1 in an integration period and second comparison processing for outputting a digitalized second comparison result signal with respect to a voltage signal corresponding to an accumulated charge of the photodiode PD1 transferred to the floating diffusion FD1 in a transfer period after the integration period. Due to this, it becomes possible to substantially realize a broader dynamic range and higher frame rate.

27 Claims, 32 Drawing Sheets

(51) Int. Cl.
*H03M 1/56* (2006.01)
*H04N 5/3745* (2011.01)
*H04N 5/355* (2011.01)
*H04N 5/341* (2011.01)
*H04N 5/369* (2011.01)

(52) U.S. Cl.
CPC ..... *H04N 5/35527* (2013.01); *H04N 5/35572* (2013.01); *H04N 5/378* (2013.01); *H04N 5/379* (2018.08); *H04N 5/37455* (2013.01)

(58) Field of Classification Search
CPC ...... H04N 5/3559; H04N 5/355; H04N 5/357; H04N 5/374
See application file for complete search history.

(56) References Cited

U.S. PATENT DOCUMENTS

| | | |
|---|---|---|
| 9,313,435 B2 | 4/2016 | Nitta et al. |
| 9,769,411 B2 | 9/2017 | Nitta et al. |
| 2010/0181464 A1 | 7/2010 | Veeder |
| 2011/0199526 A1 | 8/2011 | Nitta et al. |
| 2014/0285697 A1 | 9/2014 | Nitta et al. |
| 2016/0295145 A1 | 10/2016 | Nitta et al. |
| 2017/0272678 A1* | 9/2017 | Sakakibara ............ H04N 5/378 |
| 2017/0350756 A1* | 12/2017 | Panicacci ............... H04N 5/378 |
| 2019/0007638 A1* | 1/2019 | Ishibashi ................ H04N 5/378 |

* cited by examiner

Read out timing example

An example of time to flip sequence.
(ramped reference voltage)

An example of light – digital code plot.
15n sampling for 256 code (3usec integration time)
150uV/e with linear ramped reference voltage (10mV – 800mV)

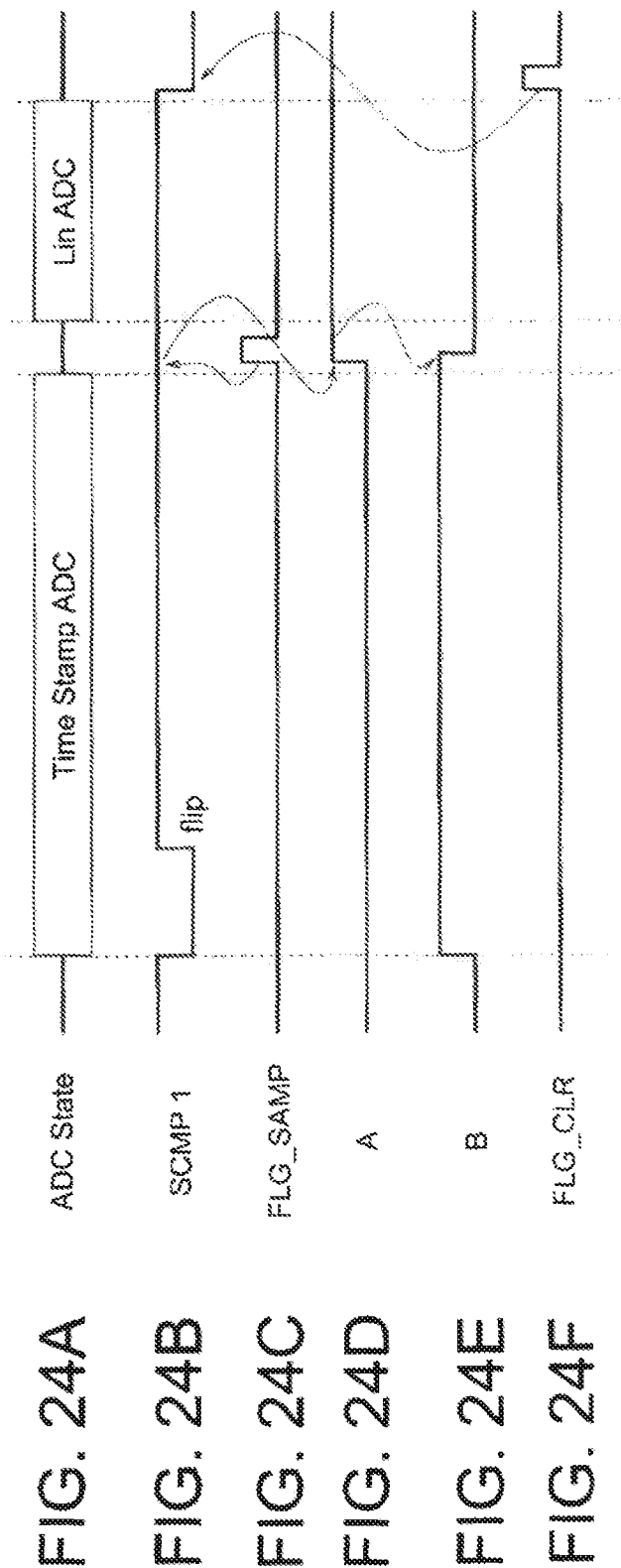

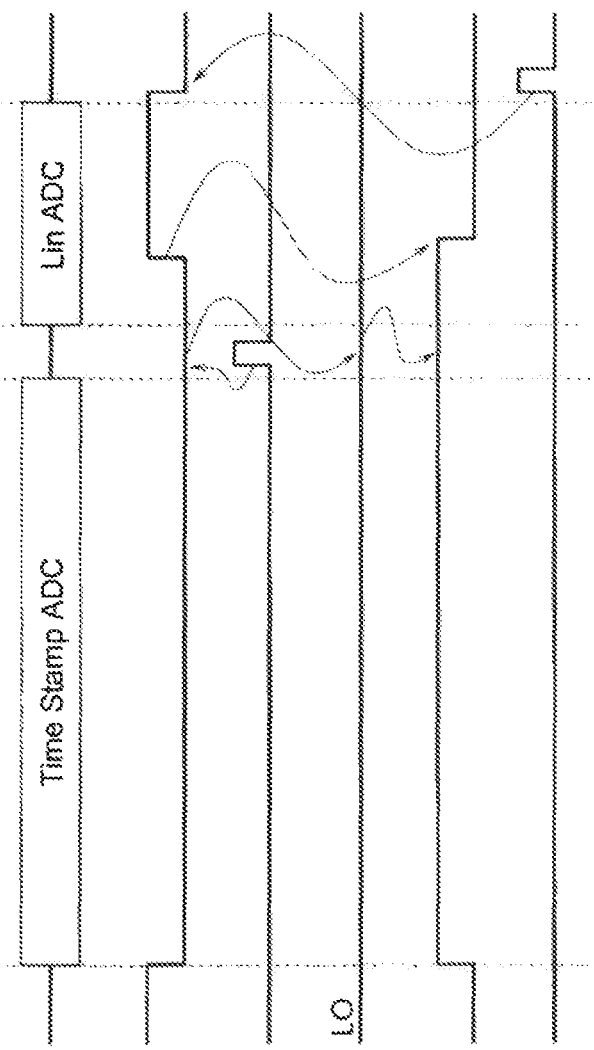

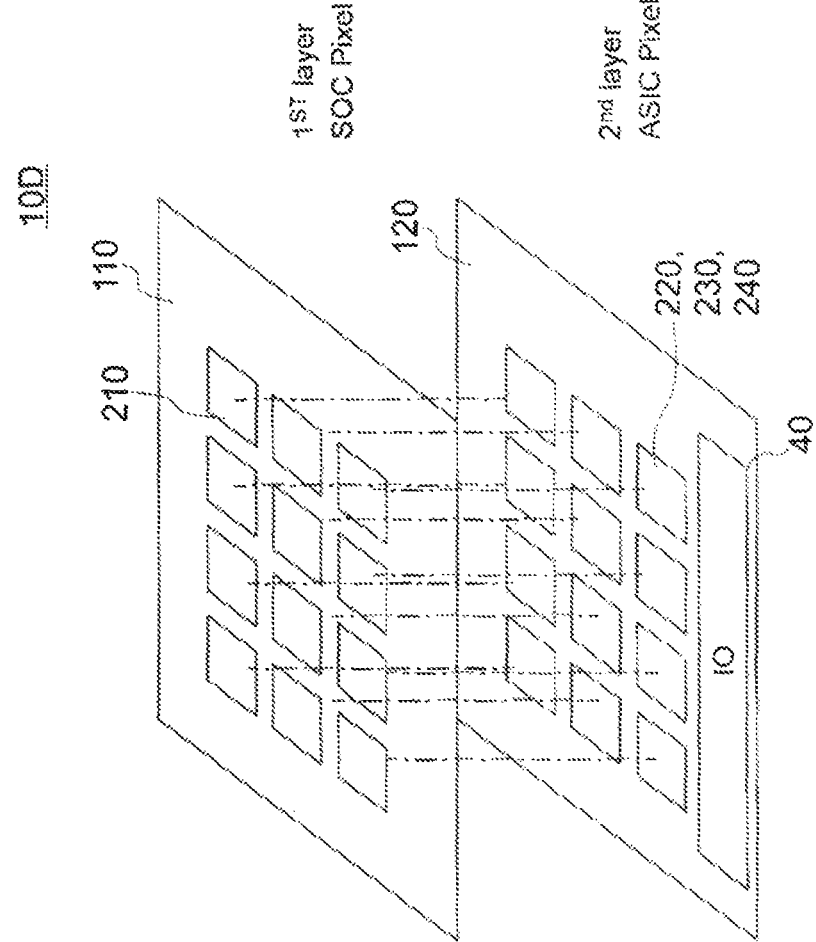
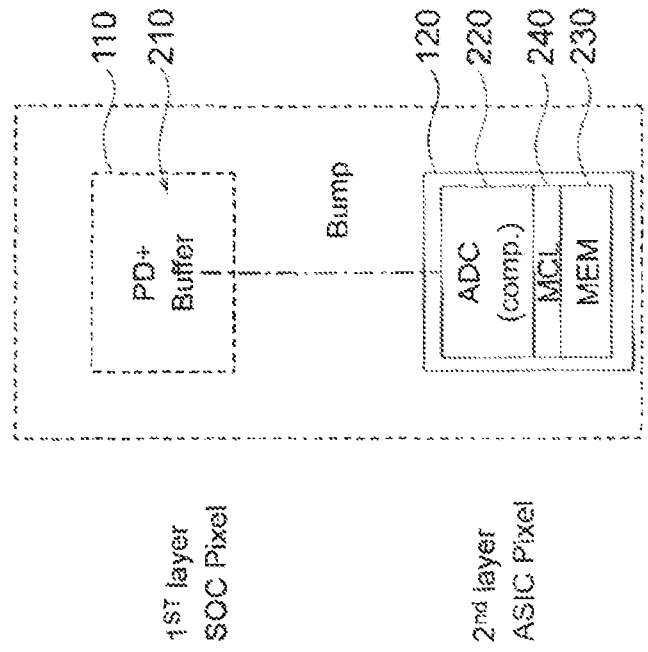

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATIONS

The present invention contains subject matter related to Japanese Patent Applications JP 2017-185502 and JP 2017-185504 filed in the Japan Patent Office on Sep. 26, 2017, the entire contents of which being incorporated herein by reference.

TECHNICAL FIELD

The present invention relates to a solid-state imaging device, a method for driving a solid-state imaging device, and an electronic apparatus.

BACKGROUND ART

As solid-state imaging devices (image sensors) using photoelectric conversion elements detecting light and generating a charge, CMOS (complementary metal oxide semiconductor) image sensors have been put into practical use. CMOS image sensors have been widely applied as parts of digital cameras, video cameras, monitoring cameras, medical endoscopes, personal computers (PC), mobile phones and other portable terminals (mobile devices) and other various types of electronic apparatuses.

A CMOS image sensor has a floating diffusion (FD) amplifier having a photodiode (photoelectric conversion element) and an FD layer (FD) for each pixel. Reading is performed by selecting a certain row in a pixel array and simultaneously reading out the pixels in a column direction, that is, a column parallel output type is the mainstream.

Further, various circuits have been proposed for the pixel signal read-out (output) circuit of a column parallel output type CMOS image sensor. Among them, one of the most advanced circuits is a circuit which is provided with an analog-to-digital converter (ADC) for each column and extracts pixel signals as digital signals (for example, see PTL 1 and PTL 2).

In this column parallel ADC-mounting CMOS image sensor (column AD system CMOS image sensor), a comparator compares a so-called RAMP wave and the pixel signals and performs digital CDS by a later stage counter to thereby perform AD conversion.

In this type of CMOS image sensor, however, while high speed transfer of signals is possible, there is the disadvantage that a global shutter reading operation cannot be carried out.

Contrary to this, a digital pixel sensor in which an ADC including a comparator (and further a memory part) is arranged in each pixel to also enable realization of a global shutter for executing the start of exposure and end of exposure at the same timings with respect to all pixels in the pixel array has been proposed (for example, see PTL 3 and PTL 4).

CITATION LIST

Patent Literature

PTL 1: Japanese Patent Publication No. 2005-278135A
PTL 2: Japanese Patent Publication No. 2005-295346A
PTL 3: U.S. Pat. No. 7,164,114, B2, FIG. 4
PTL 4: US Patent No. 2010/0181464, A1

SUMMARY OF INVENTION

Technical Problem

In this regard, however, in the CMOS image sensors provided with conventional digital pixel sensors explained above, it is possible to realize the global shutter function, but for example charges overflowing from the photodiodes in the integration period are not utilized in real time, therefore there is limit to achievement of broader dynamic range and higher frame rate.

Further, important performance indexes of CMOS image sensors include random noise. It is known that the main sources of random noise are the pixels and AD converters. In general, as techniques for reducing random noise, the methods are known of enlarging the transistor size to reduce flicker noise or of adding a capacity to the output of the comparator and lowering the bandwidth to thereby aim at a filter effect of noise by CDS. However, in each technique, there are disadvantages such as an increase in area, degradation of inversion delay of the comparator due to the increase of capacity, and the frame rate of the imaging element not being able to be raised.

Further, since an ADC (further a memory part) including a comparator is arranged in each pixel, it is difficult to expand the effective pixel region to the maximum limit and is difficult to maximize the value relative to the cost.

The present invention provides a solid-state imaging device capable of substantially realizing a broader dynamic range and a higher frame rate, a method for driving such a solid-state imaging device, and an electronic apparatus. Further, the present invention provides a solid-state imaging device capable of substantially realizing a broader dynamic range and a higher frame rate and in addition capable of lowering noise, capable of expanding the effective pixel region to the maximum limit, and capable of raising the value relative to the cost to the maximum, a method for driving such a solid-state imaging device, and an electronic apparatus.

Solution to Problem

A solid-state imaging device of a first aspect of the present invention has a pixel part in which pixels for performing photoelectric conversion are arranged and a reading part for reading out pixel signals from the pixels in the pixel part, wherein each pixel includes a photoelectric conversion element which accumulates a charge generated by photoelectric conversion in an integration period, a transfer element capable of transferring the charge accumulated in the photoelectric conversion element in a transfer period after the integration period, an output node to which the charge accumulated in the photoelectric conversion element is transferred through the transfer element, an output buffer part which converts the charge at the output node to a voltage signal corresponding to the quantity of the charge and outputs the converted voltage signal, and a comparator which performs comparison processing comparing the voltage signal from the output buffer part and a reference voltage and outputting a digitalized comparison result signal and wherein the comparator, under the control of the reading part, performs first comparison processing for outputting a digitalized first comparison result signal with respect to a voltage signal corresponding to an overflow charge overflowing from the photoelectric conversion element to the output node in the integration period and second comparison processing for outputting a digitalized second comparison result signal with respect to the a voltage signal corresponding to a accumulated charge of the photoelectric conversion element transferred to the output node in the transfer period after the integration period.

A second aspect of the present invention is a method for driving a solid-state imaging device having a pixel part in which pixels for performing photoelectric conversion are arranged and a reading part for reading out pixel signals from the pixels in the pixel part, wherein each pixel includes a photoelectric conversion element which accumulates a charge generated by photoelectric conversion in an integration period, a transfer element capable of transferring the charge accumulated in the photoelectric conversion element in a transfer period after the integration period, an output node to which the charge accumulated in the photoelectric conversion element is transferred through the transfer element, an output buffer part which converts the charge at the output node to a voltage signal corresponding to the quantity of the charge and outputs the converted voltage signal, and a comparator which performs comparison processing comparing the voltage signal from the output buffer part and a reference voltage and outputting a digitalized comparison result signal, comprising the steps of, in the comparator, under the control of the reading part, performing first comparison processing for outputting a digitalized first comparison result signal with respect to a voltage signal corresponding to an overflow charge overflowing from the photoelectric conversion element to the output node in the integration period and second comparison processing for outputting a digitalized second comparison result signal with respect to a voltage signal corresponding to an accumulated charge of the photoelectric conversion element transferred to the output node in the transfer period after the integration period.

An electronic apparatus of a third aspect of the present invention has a solid-state imaging device and an optical system for forming a subject image in the solid-state imaging device, wherein the solid-state imaging device includes a pixel part in which pixels each including a photoelectric converting and reading part and a signal holding part are arranged and a reading part which reads out the pixel signals from the pixel part, wherein each pixel includes a photoelectric conversion element which accumulates the charge generated by photoelectric conversion in an integration period, a transfer element capable of transferring the charge accumulated in the photoelectric conversion element in a transfer period after the integration period, an output node to which the charge accumulated in the photoelectric conversion element is transferred through the transfer element, an output buffer part which converts the charge at the output node to a voltage signal corresponding to the quantity of the charge and outputs the converted voltage signal, and a comparator which performs comparison processing comparing the voltage signal by the output buffer part and the reference voltage and outputting a digitalized comparison result signal and wherein the comparator, under the control of the reading part, performs first comparison processing for outputting the digitalized first comparison result signal with respect to a voltage signal corresponding to the overflow charge overflowing from the photoelectric conversion element to the output node in the integration period and second comparison processing for outputting the digitalized second comparison result signal with respect to a voltage signal corresponding to a accumulated charge of the photoelectric conversion element transferred to the output node in the transfer period after the integration period.

Advantageous Effects of Invention

According to the present invention, it becomes possible to substantially realize a broader dynamic range and a higher frame rate. Further, according to the present invention, it is possible to substantially realize a broader dynamic range and a higher frame rate and, in addition, is possible to lower noise and expand the effective pixel region to the maximum limit and possible to raise the value relative to the cost to the maximum limit.

BRIEF DESCRIPTION OF DRAWINGS

FIG. 24A to FIG. 24F are timing charts for explaining the operation in the memory control part where the output of the comparator inverts at the time of a time stamp ADC mode.

FIG. 25A to FIG. 25F are timing charts for explaining the operation in the memory control part where the output of the comparator does not invert at the time of a time stamp ADC mode.

FIG. 26A and FIG. 26B are schematic diagrams for explaining a stacked structure of the solid-state imaging device according to the fifth embodiment.

DESCRIPTION OF EMBODIMENTS

Embodiments of the present invention will be hereinafter explained with reference to the drawings.

First Embodiment

Figure 1:
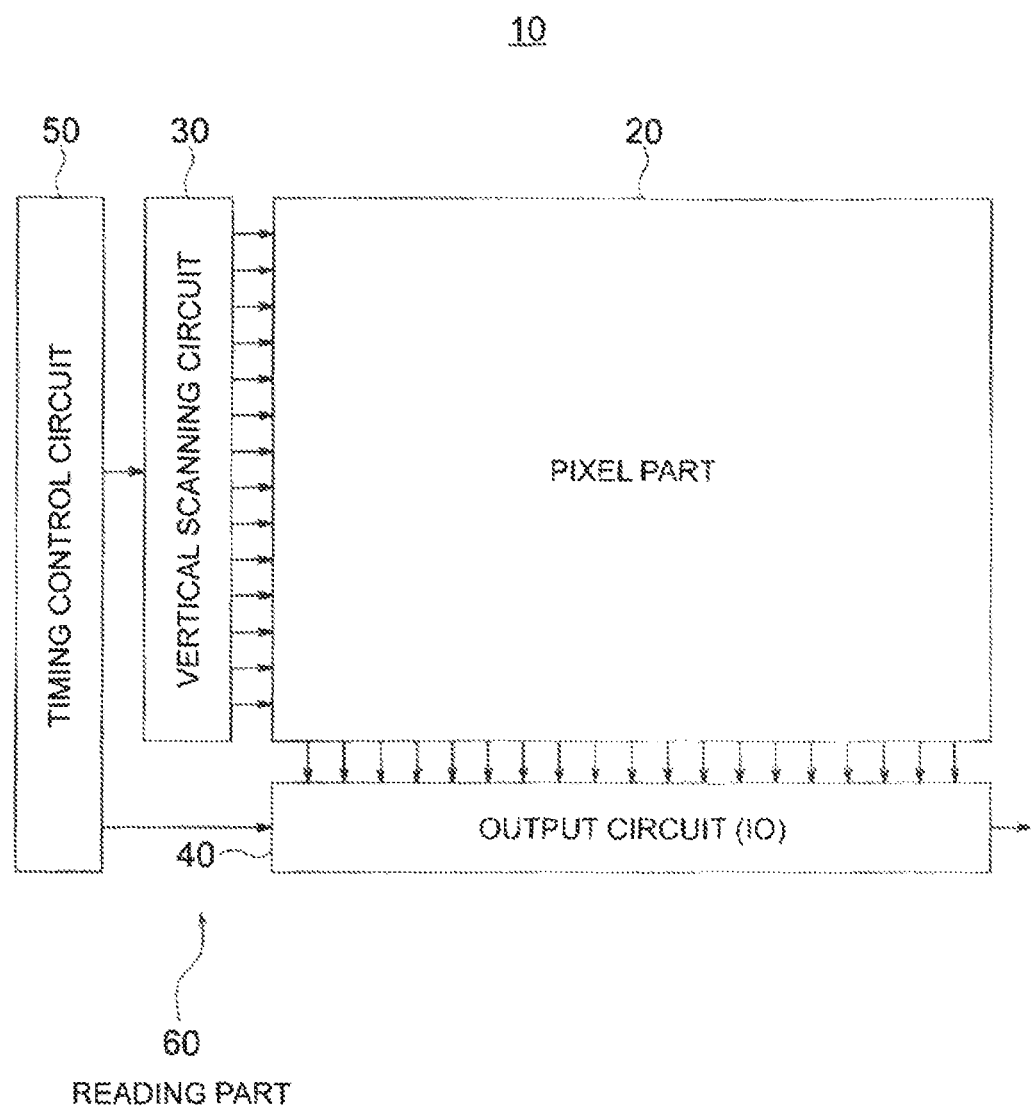
FIG. 1 is a block diagram showing an example of the configuration of a solid-state imaging device according to a first embodiment of the present invention.

FIG. 1 is a block diagram showing an example of the configuration of a solid-state imaging device according to a first embodiment of the present invention. In the present embodiment, a solid-state imaging device 10 is constituted by for example a CMOS image sensor including digital pixels as pixels.

As shown in FIG. 1, the solid-state imaging device 10 is constituted mainly by a pixel part 20, vertical scanning circuit (row scanning circuit) 30, output circuit 40, and timing control circuit 50, which serve as an image capturing part. Among these components, for example, the vertical scanning circuit 30, output circuit 40, and timing control circuit 50 constitute a reading part 60 for reading out pixel signals.

In the first embodiment, the solid-state imaging device 10 is configured as for example a laminated CMOS image sensor including, in the pixel part 20, photoelectric converting and reading parts, AD (analog-to-digital) conversion parts, and memory parts, which serve as digital pixels, and having an operation function of a global shutter. In the solid-state imaging device 10 according to the first embodiment, as will be explained in detail later, each digital pixel DP has an AD conversion function. The AD conversion part has a comparator for performing comparison processing for comparing a voltage signal read out by the photoelectric converting and reading part and a reference voltage and outputting a digitalized comparison result signal. Further, the comparator, under the control of the reading part, performs first comparison processing and second comparison processing. The first comparison processing is performed for outputting a digitalized first comparison result signal with respect to a voltage signal corresponding to an overflow charge overflowing from the photoelectric conversion element to the output node (floating diffusion) in an integration period, and the second comparison processing is performed for outputting a digitalized second comparison result signal with respect to a voltage signal corresponding to an accumulated charge of the photoelectric conversion element transferred to the output node in a transfer period after the integration period.

An outline of the configurations and functions of the parts in the solid-state imaging device 10 will be hereinafter described in detail, particularly including the configurations and functions of the pixel part 20 and digital pixels, the read-out processing related thereto, and the lamination structure of the pixel part 20 and reading part 60.

Configurations of Pixel Part 20 and Digital Pixels 200

Figure 2:
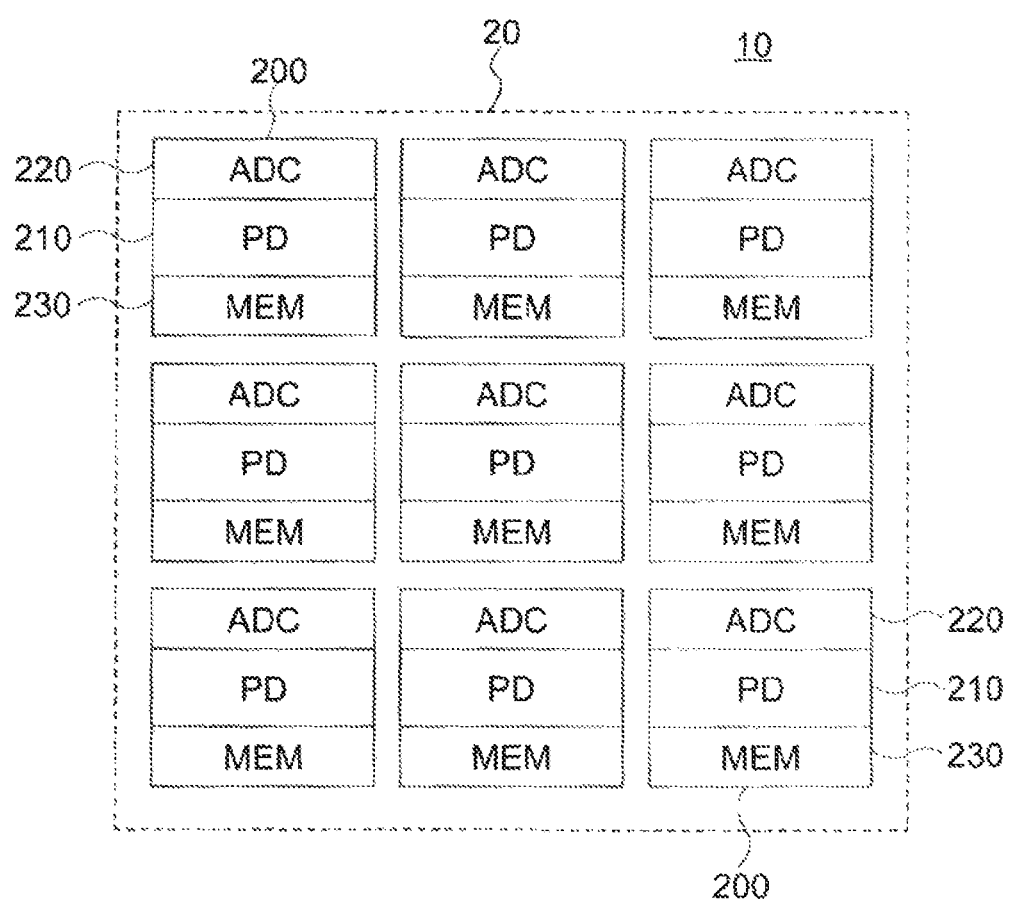
FIG. 2 is a view showing an example of a digital pixel array of a pixel part in the solid-state imaging device according to the first embodiment of the present invention.
Figure 3:
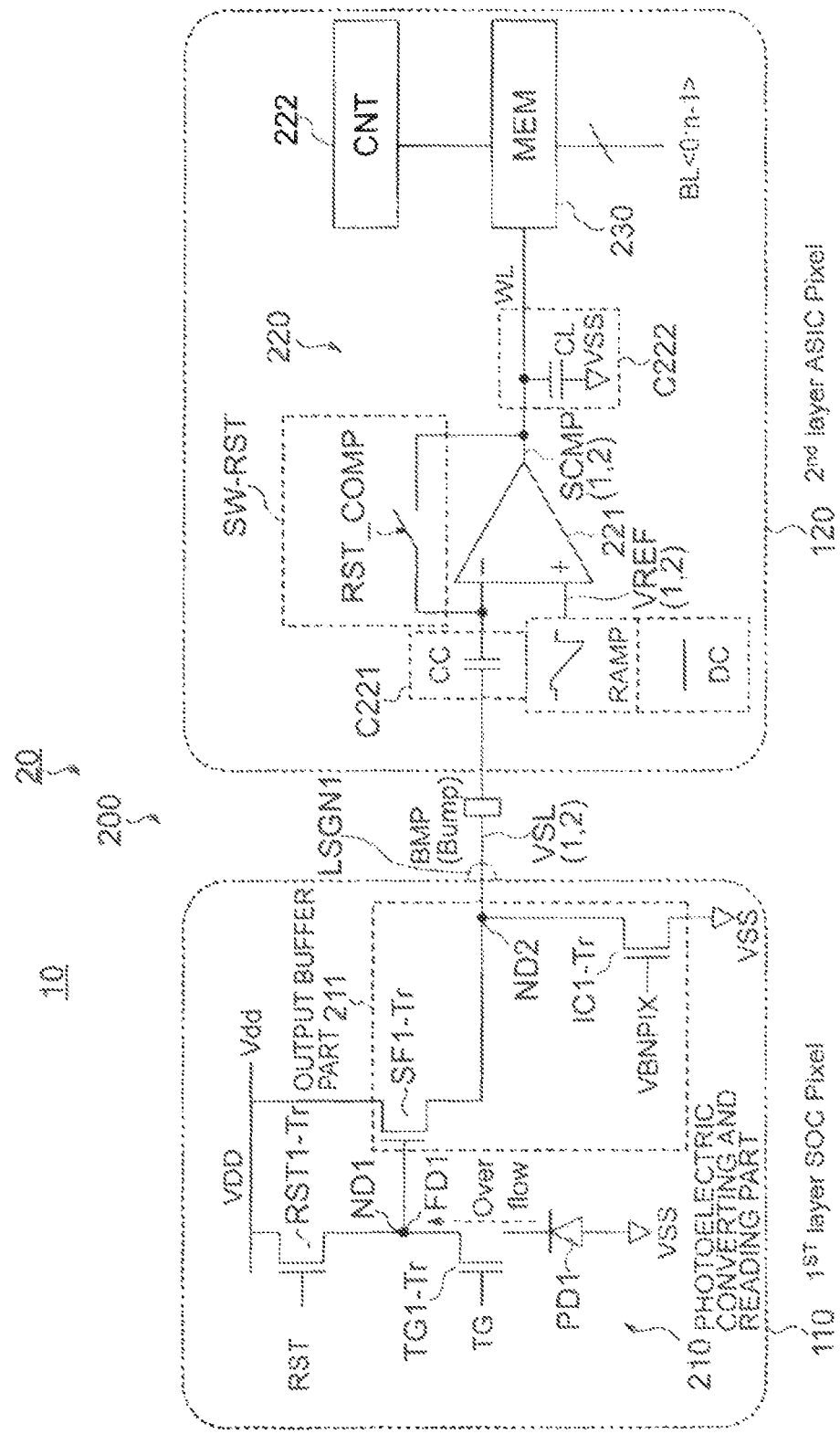
FIG. 3 is a circuit diagram showing an example of a pixel in the solid-state imaging device according to the first embodiment of the present invention.

FIG. 2 is a view showing an example of a digital pixel array of a pixel part in the solid-state imaging device 10 according to the first embodiment of the present invention. FIG. 3 is a circuit diagram showing an example of the pixel in the solid-state imaging device 10 according to the first embodiment of the present invention.

In the pixel part 20, as shown in FIG. 2, a plurality of digital pixels 200 are arranged in a matrix comprised of N rows and M columns. For simplification of the drawing, FIG. 2 shows an example including nine digital pixels 200 arranged in a matrix comprised of 3 rows and 3 columns (M=3, N=3).

The digital pixel 200 according to the first embodiment includes a photoelectric converting and reading part (shown as PD in FIG. 2) 210, an AD conversion part (shown as ADC in FIG. 2) 220, and a memory part (shown as HEM in FIG. 2) 230. As will be described in detail later, the pixel part 20 in the first embodiment is configured as a laminated CMOS image sensor constituted by a first substrate 110 and a second substrate 120. In the present example, as shown in FIG. 3, the photoelectric converting and reading part 210 is formed on the first substrate 110, and the AD conversion part 220 and the memory part 230 are formed on the second substrate 120.

The photoelectric converting and reading part 210 in the digital pixel 200 includes a photodiode (photoelectric conversion element) and an in-pixel amplifier. Specifically, the photoelectric converting and reading part 210 has for example a photodiode PD1 that serves as a photoelectric conversion element. In association with the photodiode PD1, the photoelectric converting and reading part 210 has a transfer transistor TG1-Tr as a transfer element, a reset transistor RST1-Tr as a reset element, a source follower transistor SF1-Tr as a source follower element, a current transistor IC1-Tr as a current source element, a floating diffusion FD1 as an output node ND1, and a read-out node ND2. Thus, the photoelectric converting and reading part 210 in the digital pixel 200 according to the first embodiment includes four transistors (4Tr): the transfer transistor TG1-Tr, the reset transistor RST1-Tr, the source follower transistor SF1-Tr, and the current transistor IC1-Tr.

Further, in the first embodiment, an output buffer part 211 is configured including the source follower transistor SF1-Tr, current transistor IC1-Tr, and read-out node ND2.

In the photoelectric converting and reading part 210 according to the first embodiment, the read-out node ND2 of the output buffer part 211 is connected to the input part of the AD conversion part 220. The photoelectric converting and reading part 210 converts the charge in the output node of the floating diffusion FD1 to a voltage signal corresponding to the quantity of charge and outputs the converted voltage signal VSL to the AD conversion part 220.

More specifically, the photoelectric converting and reading part 210, in a first comparison processing period PCMPR1 of the AD conversion part 220, outputs a voltage signal VSL corresponding to the overflow charge overflowing from the photoelectric conversion element of the photodiode PD1 to the output node of the floating diffusion FD1 in the integration period PI.

Further, the photoelectric converting and reading part 210, in a second comparison processing period PCMPR2 of the AD conversion part 220, outputs a voltage signal VSL corresponding to the accumulated charge of the photodiode PD1 transferred to the output node of the floating diffusion FD1 in a transfer period PT after the integration period PI. The photoelectric converting and reading part 210, in the second comparison processing period PCMPR2, outputs a read-out reset signal (signal voltage) (VRST) and read-out signal (signal voltage) (VSIG) as pixel signals to the AD conversion part 220.

The photodiode PD1 generates a signal charge (here, electrons) in an amount corresponding to the quantity of the incident light and accumulates the same. Below, an explanation will be given of a case where the signal charge is electrons and each transistor is an n-type transistor. However, the signal charge may be positive holes (holes) or each transistor may be a p-type transistor as well. Further, the present embodiment is effective also in a case where each transistor is shared among a plurality of photodiodes and transfer transistors.

In each digital pixel 200, as the photodiode (PD), use is made of a pinned photodiode (PPD). On the substrate surface for forming the photodiode (PD), there is a surface level due to dangling bonds or other defects, therefore a lot of charges (dark current) are generated due to heat energy, so a correct signal ends up being unable to be read out. In a pinned photodiode (PPD), the charge accumulation part of the photodiode (PD) is pinned in the substrate, so it becomes possible to reduce mixing the dark current into the signal.

The transfer transistor TG1-Tr in the photoelectric converting and reading part 210 is connected between the photodiode PD1 and the floating diffusion FD1 and is controlled by a control signal TG applied through a control line to the gate. The transfer transistor TG1-Tr is selected and becomes a conductive state in the transfer period PT in which the control signal TG is a high (H) level. It transfers the charge (electrons) which is photo-electrically converted and accumulated in the photodiode PD1 to the floating diffusion FD1. Note that, after the photodiode PD1 and floating diffusion FD1 are reset to the predetermined reset potentials, the transfer transistor TG1-Tr becomes a non-conductive state in which the control signal TG is a low (L) level, and the photodiode PD1 enters into the integration period PI. However, at this time, if the intensity (quantity) of the incident light is very high, the charge exceeding the saturated charge amount overflows to the floating diffusion FD1 as the overflow charge through the overflow path under the transfer transistor TG1-Tr.

The reset transistor RST1-Tr is connected between the power supply line Vdd of the power supply voltage VDD and the floating diffusion FD1 and is controlled by the control signal RST supplied through the control line to the gate. The reset transistor RST1-Tr is selected and becomes a conductive state in the reset period in which the control signal RST is the H level and resets the floating diffusion FD1 to the potential of the power supply line Vdd of the power supply voltage VDD.

The source follower element of the source follower transistor SF1-Tr is connected at the source to the read-out node ND2, is connected at the drain side to the power supply line Vdd, and is connected at the gate to the floating diffusion FD1. The drain and source of the current source element of the current transistor IC1-Tr are connected between the read-out node ND2 and the reference potential VSS (for example GND). The gate of the current transistor IC1-Tr is connected to a supply line of a control signal VBNPIX. Further, a signal line LSGN1 between the read-out node ND2 and the input part of the signal holding part 220 is driven by the current source element of the current transistor IC1-Tr.

Figure 4:
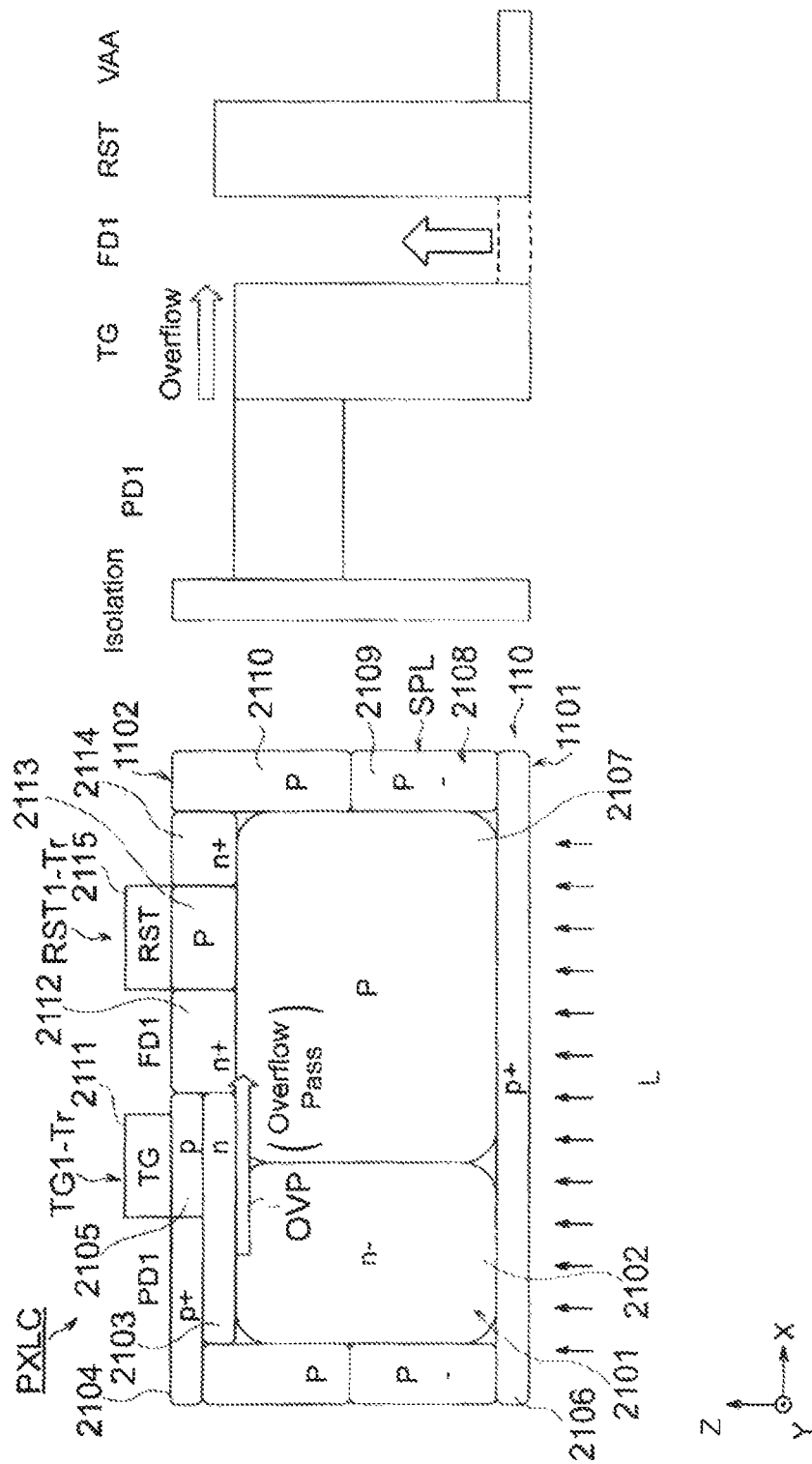
FIG. 4A and FIG. 4B are a schematic cross-sectional view showing an example of the configuration of a principal part of the digital pixel according to the first embodiment of the present invention, that is, a charge integration and transfer system, and a potential diagram at the time of overflowing.

FIG. 4A and FIG. 4B are a schematic cross-sectional view showing an example of the configuration of the principal part of the digital pixel according to the first embodiment of the present invention, that is, the charge integration and transferring system, and a potential diagram at the time of overflowing.

Each digital pixel cell PXLC is formed on a substrate (first substrate 110 in the present example) having a first substrate surface 1101 side to which the light L is irradiated (for example back face side) and a second substrate surface 1102 side on the side opposite to this first substrate surface 1101 side and is separated by separation layers SPL. Further, the digital pixel cell PLXC in FIG. 4A is configured including parts forming the photoelectric converting and reading part 210 such as the photodiode PD1, transfer transistor TG1-Tr, floating diffusion FD1, reset transistor RST1-Tr, separation layers SPL, and further a not shown color filter part and micro-lens.

Configuration of Photodiode

The photodiode PD1 includes a semiconductor layer (n-layer in the present embodiment) 2101 of a first conductivity type (n-type in the present embodiment) formed so as to be pinned in the semiconductor substrate having the first substrate surface 1101 side and the second substrate surface 1102 side on the side opposite to the first substrate surface 1101 side and is formed so as to have a photoelectric conversion function of the received light and charge accumulating function. In the side portions of the photodiode PD1 in a direction (X-direction in the orthogonal coordinate system in the drawing) perpendicular to the normal line of the substrate, second conductivity type (p-type in the present embodiment) separation layers SPL are formed.

In this way, in the present embodiment, in each digital pixel cell PXLC, as the photodiode (PD), use is made of a pinned photodiode (PPD). On the substrate surface for forming the photodiode (PD), there is a surface level due to dangling bonds or other defects, therefore a lot of charges (dark current) are generated due to heat energy, so a correct signal ends up being unable to be read out. In a pinned photodiode (PPD), the charge accumulation part of the photodiode (PD) is pinned in the substrate, so it becomes possible to reduce mixing of the dark current into the signal.

In the photodiode PD1 in FIG. 4A, the n layer (first conductivity type semiconductor layer) 2101 is configured so as to have a two-layer structure in the normal line direction of the substrate 110 (Z-direction in the orthogonal coordinate system in the drawing). In the present example, an $n^-$-layer 2101 is formed on the first substrate surface 1101 side, an n-layer 2103 is formed on the second substrate surface 1102 side of this $n^-$-layer 2102, and $p^+$-layer 2104 and p-layer 2105 are formed on the second substrate surface 1102 side of this n-layer 2103. Further, a $p^+$-layer 2106 is formed on the first substrate surface 1101 side of the $n^-$-layer 2102. The $p^+$-layer 2106 is formed uniformly covering not only the photodiode PD1, but also the separation layers SPL and further other digital pixel cells PXLC.

Note that, on the light incident side of this $p^+$-layer 2106, a color filter part is formed. Further, a micro-lens is formed on the light incident side of the color filter part so as to correspond to a portion of the photodiode PD1 and separation layers SPL.

These configurations are one example. The structure may be a single layer structure or may be a three-layer, four-layer, or higher stacked structure.

Configuration of Separation Layers in X-Direction (Column Direction)

In a p-type separation layer SPL in the X-direction (column direction) in FIG. 4A, a first p-layer (second conductivity type semiconductor layer) 2107 is formed on the side contacting the $n^-$-layer 2102 of the photodiode PD1 and at the right side part in the direction (X-direction in the orthogonal coordinate system in the drawing) perpendicular to the normal line of the substrate. Further, in a p-type separation layer SPL, on the right side in the X-direction of the first p-layer 2107, a second p-layer (second conductivity type semiconductor layer) 2108 is formed so as to give a two-layer structure in the normal line direction of the substrate 110 (Z-direction in the orthogonal coordinate system in the drawing). In the present example, in the second p-layer 2108, a $p^-$-layer 2109 is formed on the first substrate surface 1101 side, while a p-layer 2110 is formed on the second substrate surface 1102 side of this $p^-$-layer 2109.

These configurations are one example. The structure may be a single layer structure or may be a three-layer, four-layer, or higher stacked structure.

On the first substrate surface 1101 side of the first p-layer 2107 and second $p^-$-layer 2109 in the p-type separation layer SPL, a $p^+$-layer 2106 the same as the photodiode PD1 is formed.

An n-layer 2103 is formed so as to extend so that an overflow path OVP is formed covering a portion on the second substrate surface 1102 side of the first p-layer 2107 in the p-type separation layer SPL. Further, on the p-layer 2105 on the second substrate surface 1102 side of the n-layer 2103, a gate electrode 2111 of the transfer transistor TG1-Tr is formed through a gate insulation film. Further, on the second substrate surface 1102 side of the first p-layer 2107 in the p-type separation layer SPL, an $n^+$-layer 2112 for forming the floating diffusion FD1 is formed. A p-layer 2113 for forming the channel-forming region of the reset transistor RST1-Tr is formed adjacent to the $n^+$-layer 2112 while an $n^+$-layer 2114 is formed adjacent to the p-layer 2113. Further, on the p-layer 2113, a gate electrode 2115 is formed through a gate insulation film.

In such a structure, if the intensity (quantity) of the incident light is very high, a charge exceeding the saturated charge amount overflows as the overflow charge to the floating diffusion FD1 through the overflow path OVP under the transfer transistor TG1-Tr.

The AD conversion part 220 in the digital pixel 200 has a function of comparing the analog voltage signal VSL output by the photoelectric converting and reading part 210 with for example a reference voltage VREF of a ramp waveform changed with a predetermined inclination or a fixed voltage and converting the same to a digital signal.

The AD conversion part 220, as shown in FIG. 3, is configured including a comparator (COP) 221, counter (CNT) 222, input side coupling capacitor C221, output side load capacitor C222, and reset switch SW-RST.

In the comparator 221, the first input terminal of the inverted input terminal (−) is supplied with the voltage signal VSL which was output from the output buffer part 211 of the photoelectric converting and reading part 210 to the signal line LSGN1, while the second input terminal of the non-inverted input terminal (+) is supplied with the reference voltage VREF. The comparator performs comparison processing comparing the voltage signal VST and the reference voltage VREF and outputting the digitalized comparison result signal SCMP.

In the comparator 221, the coupling capacitor C221 is connected to the first input terminal of the inverted input terminal (−). By AC-coupling of the output buffer part 211 of the photoelectric converting and reading part 210 on the first substrate 110 side and the input part of the comparator 221 in the AD conversion part 220 on the second substrate 120 side, it is possible to lower noise and to realize a high SUR at the time of low light.

Further, in the comparator 221, the reset switch SW-RST is connected between the output terminal and the first input terminal of the inverted input terminal (−), while the load capacitor C222 is connected between the output terminal and the reference potential VSS.

Basically, in the AD conversion part 220, the analog signal (potential VSL) read out from the output buffer part 211 of the photoelectric converting and reading part 210 to the signal line LSGN1 is compared in the comparator 251 with the reference voltage VREF, for example, a ramp signal RAMP with a slope waveform linearly changing with a certain inclination. At this time, a counter 222 which is arranged for each column in the same way as the comparator 221 is operating. Therefore, by the ramp signal RAMP with the ramp waveform and the counter value changing in one-to-one correspondence, the voltage signal VSL is converted to a digital signal. Basically, in the AD conversion part 220, the change of the reference voltage VREF (for example ramp signal RAMP) is conversion of a change of voltage to a change of time. By counting that time in certain cycle (clock), it is converted to a digital value. Further, when the analog signal VSL and the ramp signal RAMP (reference voltage VREF) cross, the output of the comparator 221 inverts and the input clock of the counter 222 is stopped or the clock stopped being input is input to the counter 222. The value (data) of the counter 222 at that time is stored in the memory part 260 to thereby complete the AD conversion. After the end of the above AD conversion period, the data (signal) stored in the memory part 230 in each digital pixel 200 is output from the output circuit 40 to a not shown signal processing circuit, whereupon a two-dimensional image is generated by predetermined signal processing.

First Comparison Processing and Second Comparison Processing in Comparator 221

Further, the comparator 221 in the AD conversion part 220 in the first embodiment is controlled in drive by the reading part 60 so as to perform the following two processings, i.e., the first comparison processing and the second comparison processing, in the reading period of pixel signals.

In the first comparison processing CMPR1, under the control of the reading part 60, the comparator 221 outputs a digitalized first comparison result signal SCMP1 with respect to a voltage signal VSL1 corresponding to the overflow charge overflowing from the photoelectric conversion element of the photodiode PD1 to the output node of the floating diffusion FD1 in the integration period PI. Note that, the operation of this first comparison processing CMPR1 is also referred to as a "time stamp ADC mode operation".

In the second comparison processing CMPR2, under the control of the reading part 60, the comparator 221 outputs a digitalized second comparison result signal SCMP2 with respect to a voltage signal VSL2 (VSIG) corresponding to the accumulated charge of the photodiode PD1 transferred to the output node of the floating diffusion FD1 in the transfer period PT after the integration period PI. In actuality, in the second comparison processing CMPR2, a voltage signal VSL2 (VSIG) corresponding to the accumulated charge is digitalized, then a voltage signal VSL2 (VRRT) corresponding to the reset voltage of the floating diffusion FD1 at the time of resetting is digitalized. Note that, the operation of this second comparison processing CMPR2 is also referred to as a "linear ADC mode operation".

Note that, in the present embodiment, basically the integration period PI is the period from when the photodiode PD1 and floating diffusion FD1 are reset to the reset level to when the transfer transistor TG1-Tr is switched to a conductive state and the transfer period PT is started. The period PCMPR1 of the first comparison processing CMPR1 is the period after the start of resetting of the photodiode PD1 and floating diffusion FD1 to the reset level up to when the floating diffusion FD1 is reset to the reset level before the start of the transfer period PT. The period PCMPR2 of the second comparison processing CMPR2 is the period after the reset of the floating diffusion FD1 to the reset level and is the period including the transfer period PT and following period.

Figure 5:
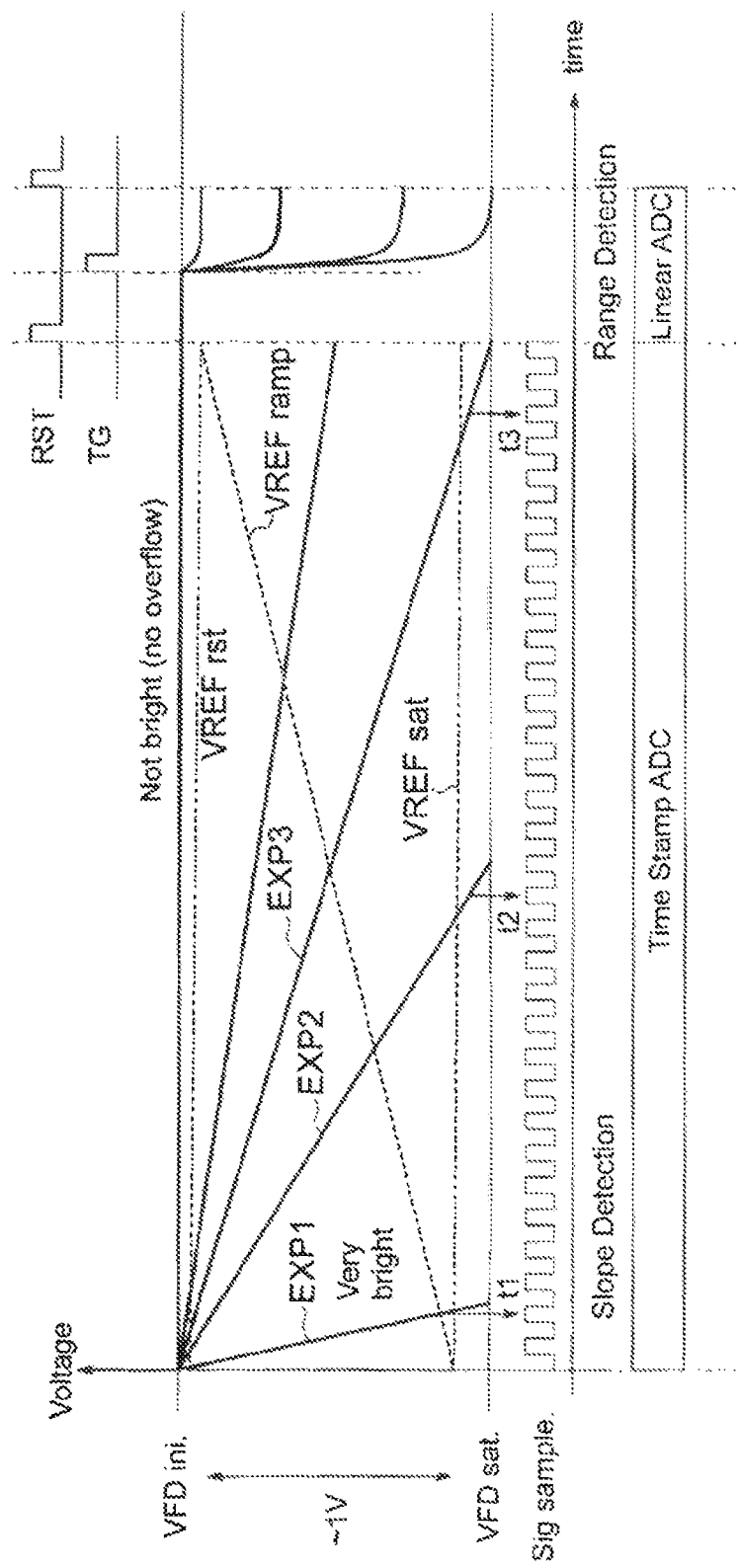
FIG. 5 is a view for explaining first comparison processing of a comparator according to the present embodiment.

Here, the first comparison processing CMPR1 will be further explained in detail. FIG. 5 is a view for explaining the first comparison processing CMPR1 of the comparator 221 according to the present embodiment. In FIG. 5, an abscissa indicates the time, and an ordinate indicates the voltage level VFD of the output node of the floating diffusion FD1.

Looking at the voltage level VFD of the floating diffusion FD1, at the time of the reset level, the quantity of charge is the smallest and the voltage level VFD becomes the highest level VFDini. On the other hand, at the time of the saturation state, the quantity of charge is the largest and the voltage level VID becomes a low level VFDsat. According to such conditions, the reference voltage VREF1 of the comparator 221 is set to a voltage VREFsat which is fixed to the level at the time of the non-saturation state before the saturation state or is set to a ramp voltage VREFramp changing from a voltage level VREFrst at the time of reset level up to the voltage level VREFsat.

If such a reference voltage VREF1 is set at VREFsat or VREFramp at the time of the first comparison processing CPR1, as shown in FIG. 5, at the time of high light when the intensity of the incident light is high, the quantity of charge is larger, therefore the time of flipping (inversion) of the output of the comparator 221 is fast. In a case of example EXP1 of the highest light, the output of the comparator 221 immediately flips (inverts) from the first level (for example low level) to the second level (high level) at the time t1. In a case of example EXP2 of light lower than that in example EXP1, the output of the comparator 221 flips (inverts) from the first level (for example low level) to the second level (high level) at the time t2 later than the time t1. In a case of example EXP3 of a light lower than that in example EXP2, the output of the comparator 251 flips (inverts) from the first level (for example low level) to the second level (high level) at the time t3 later than the time t2.

In this way, in the first comparison processing CMPR1, the comparator 221 outputs the first comparison result signal SCMP1 with respect to the time corresponding to the quantity of overflow charge from the photodiode PD1 to the floating diffusion FD1 for a predetermined time period in the integration period PI.

More specifically, in the first comparison processing CPR1, the comparator 221 can handle comparison processing with a light level from a signal level corresponding to a predetermined threshold value of the photodiode PD1 at the maximum sampling time at which the overflow charge begins to overflow from the photodiode PD1 to the output node of the floating diffusion FD1 to the signal level obtained at the minimum sampling time.

As explained above, the photo conversion operation in the time stamp ADC mode is executed in the integration period PI accompanied by light-to-time conversion. As shown in FIG. 5, under a very bright light, the output state of the comparator 221 is inverted from the first level (for example low level) to the second level (high level) imediately after the reset activation period, and the light level thereof corresponds to the saturation signal (well capacity) explained by the following time:

((FD saturation amount×integration time)/sampling period)+PD saturation amount

For example, assume that FD saturation: 8Ke@150 uV/e to 1.1 fF of FD capacity, minimum sampling time: 15 nsec, and integration time: 3 msec.

In this time stamp ADC operation mode, as explained above, it is possible to cover the light level from a signal level corresponding to the predetermined threshold value of the photodiode PD1 at the maximum sampling time at which the overflow charge begins to overflow from the photodiode PD1 to the output node of the floating diffusion FD1 to a signal level obtained at the minimum sampling time.

Figure 6:
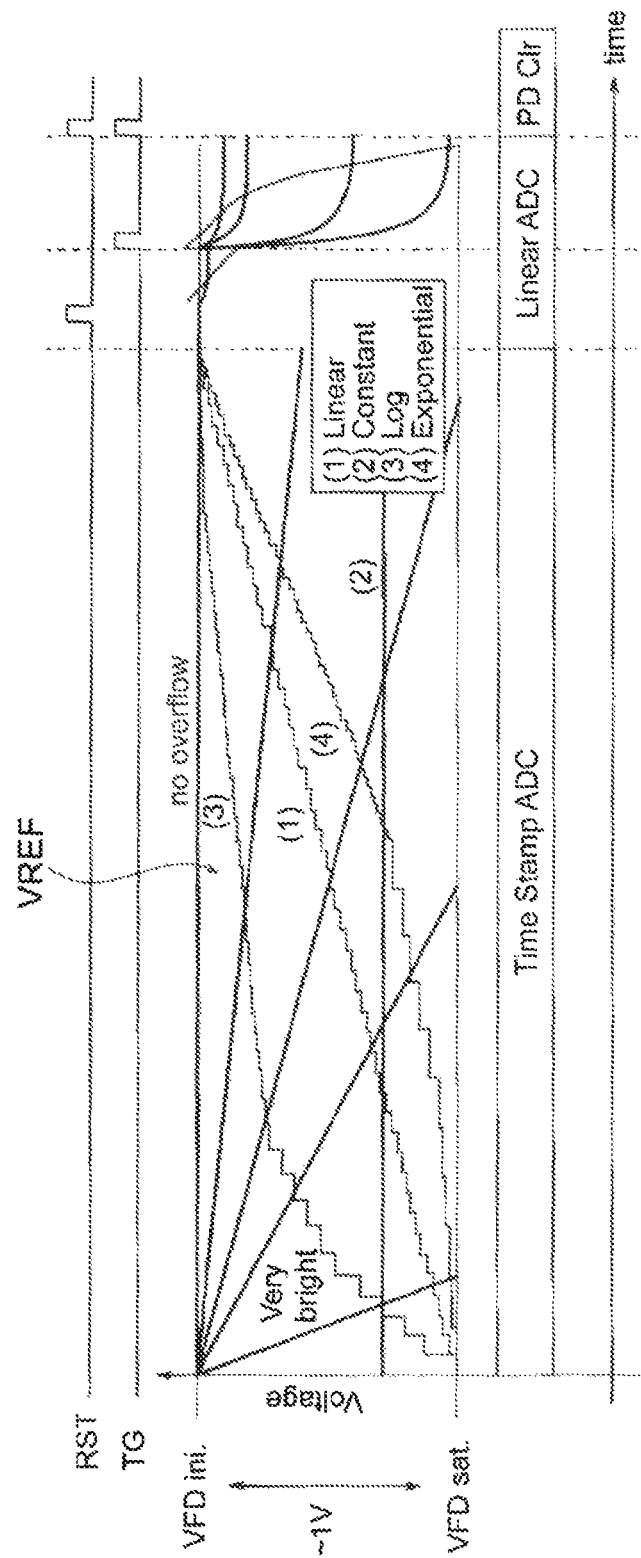
FIG. 6 is a view for explaining first comparison processing of a comparator according to the present embodiment and explaining an example of another pattern of a reference voltage.

FIG. 6 is a view for explaining the first comparison processing CMPR1 of the comparator 221 according to the present embodiment and explaining an example of another pattern of the reference voltage.

The reference voltage VREF may be a ramp waveform (signal) RAMP changing with a predetermined inclination as indicated by (1) in FIG. 6 or a fixed voltage DC indicated by (2) in FIG. 6 as well. Further, it may be a log indicated by (3) in FIG. 6 or a voltage signal taking an exponential value indicated by (4) in FIG. 6 as well.

That is, in the first embodiment, under the control of the reading part 60, in the first comparison processing CMPR1, the comparator 221 basically changes the reference voltage VREF1 throughout the integration period while sampling the levels of the output node ND1 of the floating diffusion FD1.

For example, under the control of the reading part 60, in the first comparison processing CMPR1, the comparator 221 linearly changes the reference voltage VREF1 throughout the integration period relative to the sampling interval in accordance with the desired characteristics while sampling the levels of the output node ND1 of the floating diffusion FD1 in accordance with the light intensity. As the linear reference voltage VREF in this case, a ramp waveform (signal) RAMP changed with the predetermined inclination indicated by (1) in FIG. 6 can be exemplified.

For example, under the control of the reading part 60, in the first comparison processing CMPR1, the comparator 221 non-linearly changes the reference voltage VREF1 relative to the sampling interval in accordance with the desired characteristics throughout the integration period while sampling the levels of the output node ND1 of the floating diffusion FD1 in accordance with the light intensity. As the non-linear reference voltage VREF in this case, a log indicated by (3) in FIG. 6 and a voltage signal taking an exponential value indicated by (4) in FIG. 6 can be exemplified In the sampling of the log system indicated by (3) in FIG. 6, coarse-fine sampling making the sampling interval coarse from the start to the middle (half-way) and making the sampling interval fine after the middle is carried out.

In the exponential sampling indicated by (4) in FIG. 6, fine-coarse sampling making the sampling interval fine at the time of start, making the sampling interval coarse up to the middle, and making the sampling interval fine after the middle is carried out.

Figure 7:
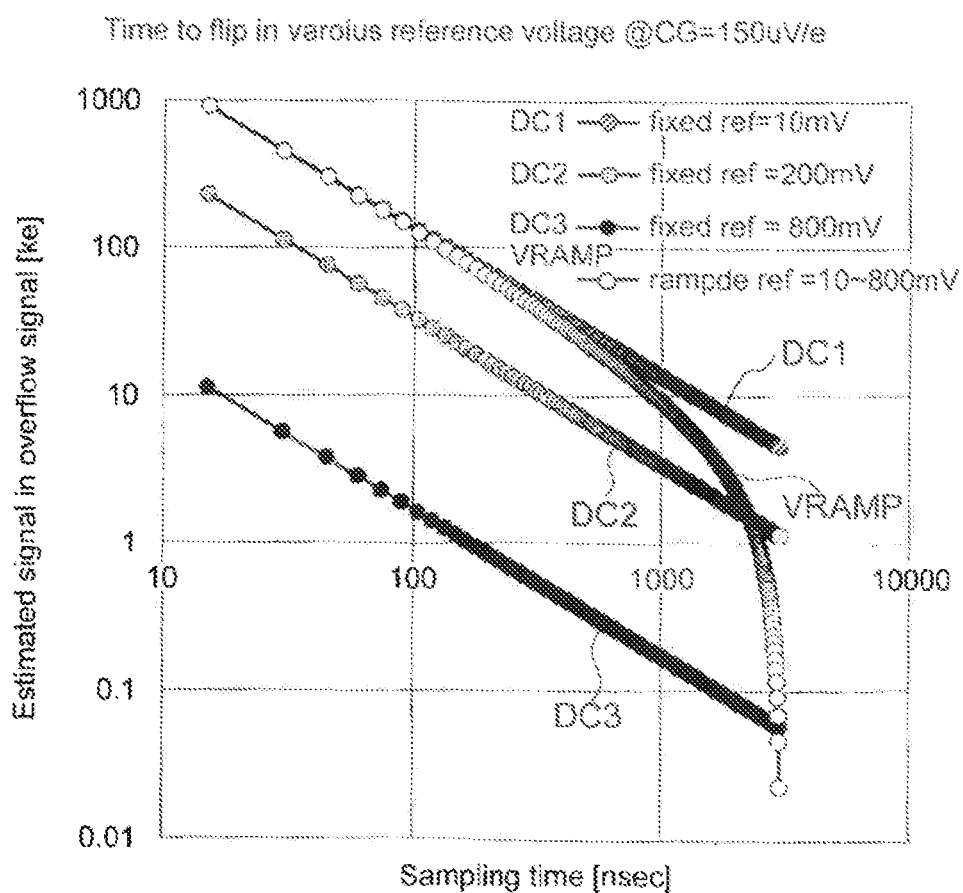
FIG. 7 is a view showing a state of light-to-time conversion where various reference voltages are input to the comparator according to the present embodiment.

FIG. 7 is a view showing states of light-to-time conversion where various reference voltages VREF are input to the comparator according to the present embodiment. In FIG. 7, an abscissa indicates the sampling time, while an ordinate indicates the estimated signal in the overflow signal. Note that, the overflow signal referred to here is a signal estimated by rendering the transfer transistor TG1-Tr the conductive state to set a condition the charge is not accumulated in the photodiodes PD1 (non-overflow).

FIG. 7 shows a sampling time at which the comparator 221 inverts which corresponds to the overflow charge (signal) according to the nature (suitability) of the light applied. FIG. 7 shows the sampling time which inverts for a variety of fixed reference voltages DC1, DC2, and D3 and ramp reference voltage VRAMP. Here, use is made of a linear reference ramp.

When the operation of the time stamp ADC mode for performing the first comparison processing CMPR1 with respect to the saturated overflow charge as described above ends, after resetting the floating diffusion FD1 and comparator 221, the processing shifts to the operation of the linear ADC mode for performing the second comparison processing CMPR2 with respect to the non-saturated charge.

Figure 8:
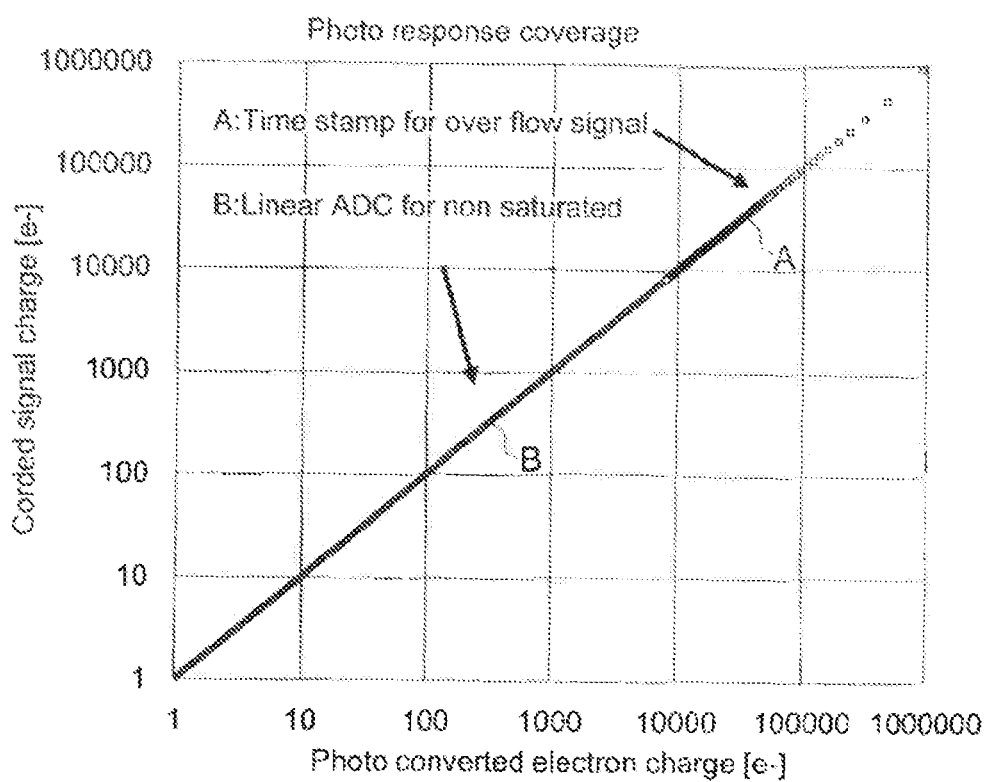
FIG. 8 is a view showing a photo response coverage in the digital pixel according to the first embodiment of the present invention.

FIG. 8 is a view showing a photo response coverage in the digital pixel according to the first embodiment of the present invention. In FIG. 8, A indicates the signal according to the time stamp ADC mode operation, and B indicates the signal according to the linear ADC mode operation.

The time stamp ADC mode has a photo response with respect to very bright light, therefore the linear ADC mode can have a photo response from a dark level. For example, a dynamic range performance of 120 dB can be realized. For example, as explained above, the saturation signal of the photo conversion range is 900 Ke. The linear ADC mode is a usual reading mode operation to which ADC is applied, therefore can cover from a noise level of 2e up to the saturation of the photodiode PD1 and floating diffusion FD1 of 8 Ke. The coverage of the linear ADC mode can be expanded to 30 Ke by an additional switch and capacity.

Figure 9:
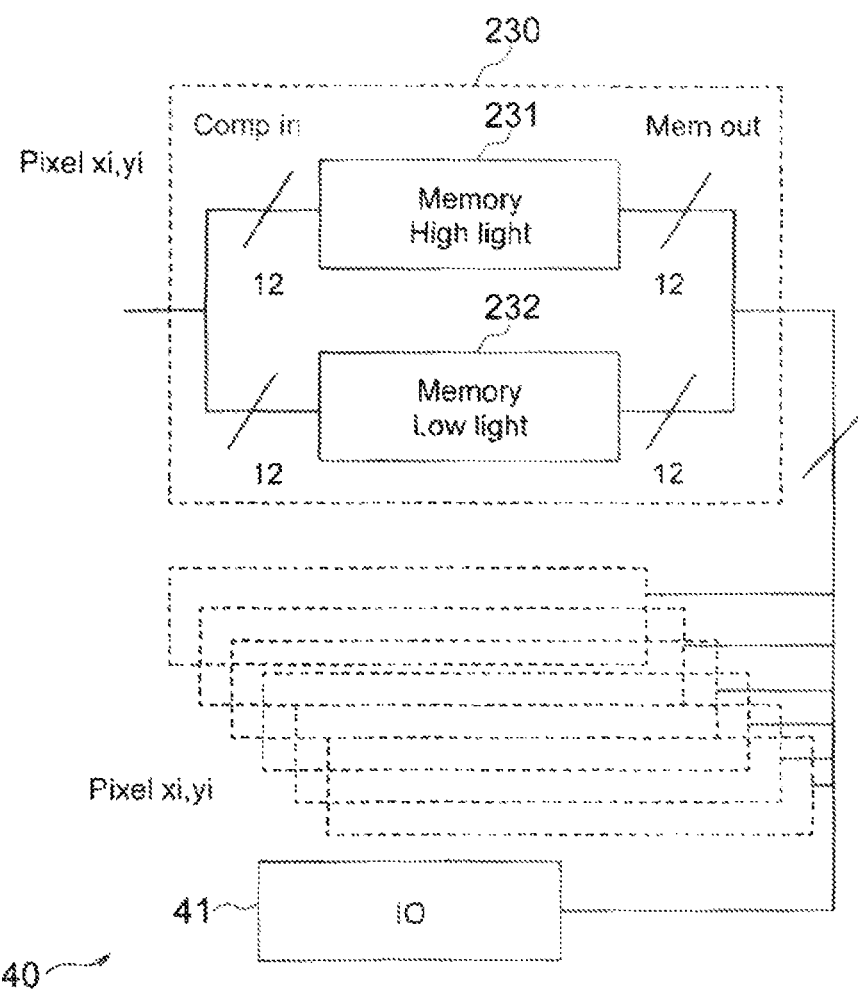
FIG. 9 is a view showing an example of the configurations of a memory part and an output circuit according to the first embodiment of the present invention.

FIG. 9 is a view showing an example of the configuration of a memory part and output circuit according to the first embodiment of the present invention.

In the comparator 221, the first comparison result signal SCMP1 obtained by digitalization of a voltage signal corresponding to the overflow charge of the floating diffusion FD1 by the first comparison processing CPR1 and the second comparison result signal SCMP2 obtained by digitalization of the accumulated charge in the photodiode PD1 by the second comparison processing CMPR2 are stored as digital data in the memories 231 and 232 of n bits, for example 12 bits, linked with each other. The memory part 230 is configured by an SRAM or DRAM, and the digital-converted signal is supplied to this. It can handle a photo conversion code and can be read out by an external IO buffer 41 of the output circuit 40 on the periphery of the pixel array.

Figure 10:
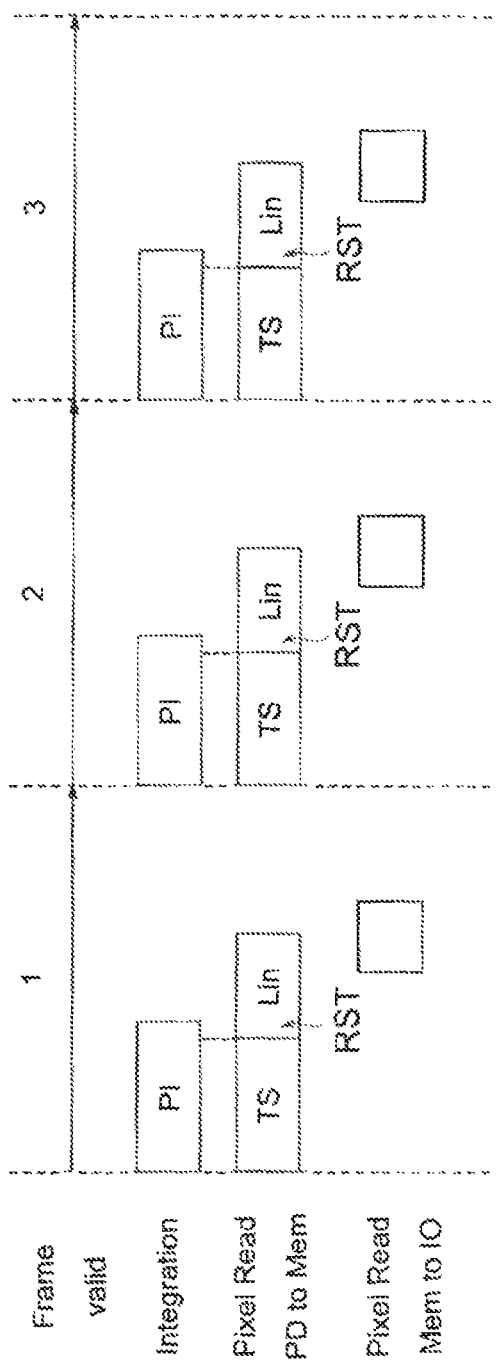
FIG. 10 is a view showing an example of a frame read out sequence in the solid-state imaging device according to the first embodiment of the present invention.

FIG. 10 is a view showing an example of the frame read out sequence in the solid-state imaging device 10 according to the first embodiment of the present invention. Here, an example of the frame reading-out method in the solid-state imaging device 10 will be explained. In FIG. 10, TS indicates the processing time of the time stamp ADC, and Lin indicates the processing period of the linear ADC.

As explained above, the overflow charge is accumulated in the floating diffusion FD1 in the integration period PI. The time stamp ADC mode operates in the integration period PI. In actuality, the time stamp ADC mode operates for a period in the integration period PI up to the reset of the floating diffusion FD1. When the operation of the time stamp ADC mode ends, the operation shifts to the linear ADC mode were conversion is carried out so as to read out the signal (VRST) at the time of reset of the floating diffusion FD1 and store the digital signal in the memory part 230. Further, after the end of the integration period PI, in the linear ADC mode, conversion is carried out so as to read the signal (VSIG) corresponding to the accumulated charge of the photodiode PD1 and store the digital signal in the memory part 230. The read-out frame is output by reading the digital signal data from the memory node and is sent through a buffer which has such an MIPI data format, for example, an IO buffer 41 of the output circuit 40 (FIG. 9), to the outside of the solid-state imaging device 10 (image sensor). This operation can be globally executed with respect to the entire pixel array.

Further, in the pixel part 20, the reset transistors RST1-Tr and transfer transistors TG1-Tr are used to reset the photodiodes PD1 simultaneously for all of the pixels to thereby start the exposure for all of the pixels simultaneously and in parallel. Further, after the predetermined exposure period (integration period PI) ends, the transfer transistors TG1-Tr are used to sample the output signals from the photoelectric converting and reading parts 210 at the AD conversion parts 220 and memory parts 230 to thereby end the exposure simultaneously and in parallel for all pixels. Due to this, a global shutter operation is realized electronically.

The vertical scanning circuit 30 drives the photoelectric converting and reading parts 210 in the digital pixels 200 through the row scanning control line in the shutter rows and read rows under the control of the timing control circuit 50. Under the control of the timing control circuit 50, the vertical scanning circuit 30 supplies reference voltages VREF1 and VREF2 set according to the first comparison processing CMPR1 and second comparison processing CMPR2 to the comparators 221 in the digital pixels 200. Further, the vertical scanning circuit 30, according to the address signals, outputs the row selection signals of row addresses of the read row for reading of the signal and the shutter row for resetting the charges accumulated in the photodiodes PD.

The output circuit 40, for example, as shown in FIG. 9, includes the IO buffer 41 arranged corresponding to the memory output of each digital pixel 200 in the pixel part 20 and outputs the digital data read out from each digital pixel 200 to the outside.

The timing control circuit 50 generates timing signals necessary for signal processing of the pixel part 20, vertical scanning circuit 30, output circuit 40, and the like.

In the first embodiment, for example, at the time of global shutter mode, the reading part 60 performs the read-out control of the pixel signals from the digital pixels 200.

Stacked Structure of Solid-State Imaging Device 10

Next, the stacked structure of the solid-state imaging device 10 according to the first embodiment will be explained.

Figure 11A:
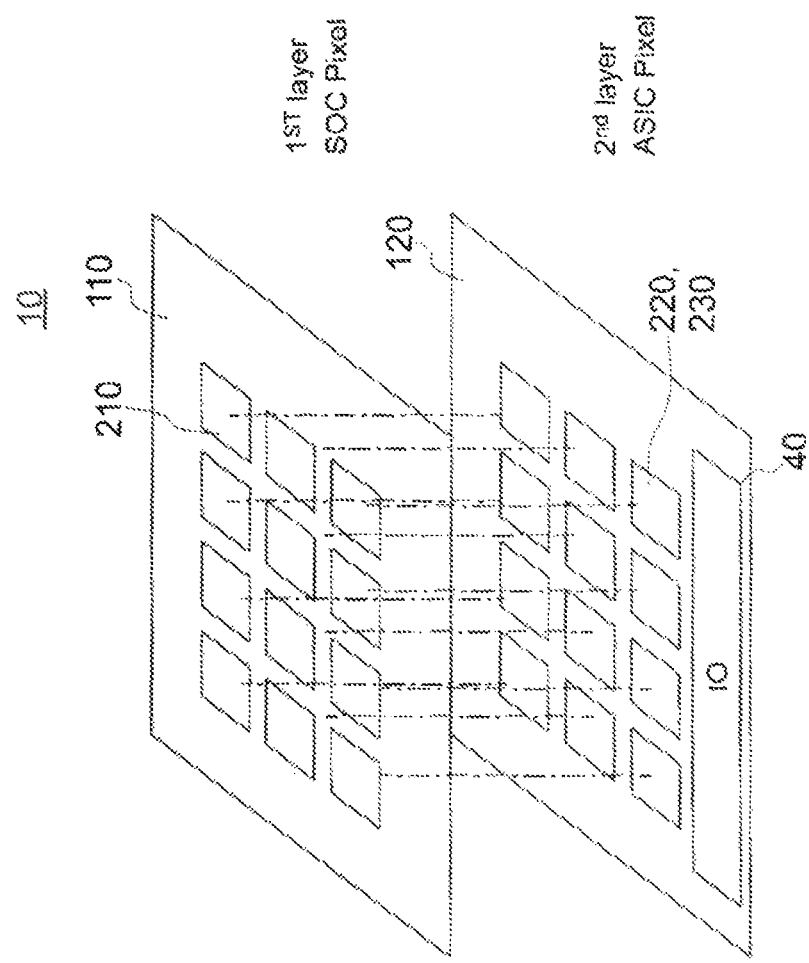
FIG. 11A and FIG. 11B are schematic diagrams for explaining a stacked structure of the solid-state imaging device according to the first embodiment.
Figure 11B:
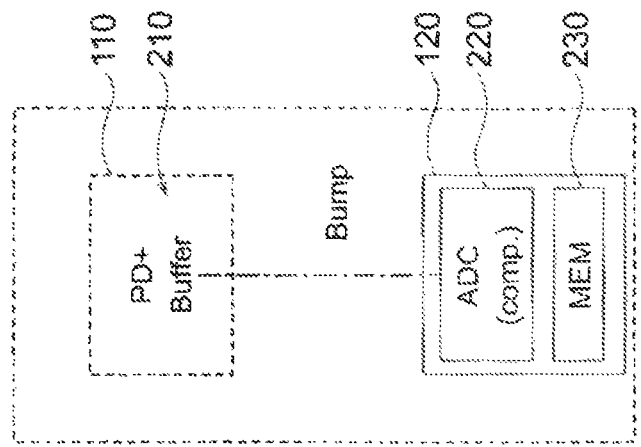
Figure 12:
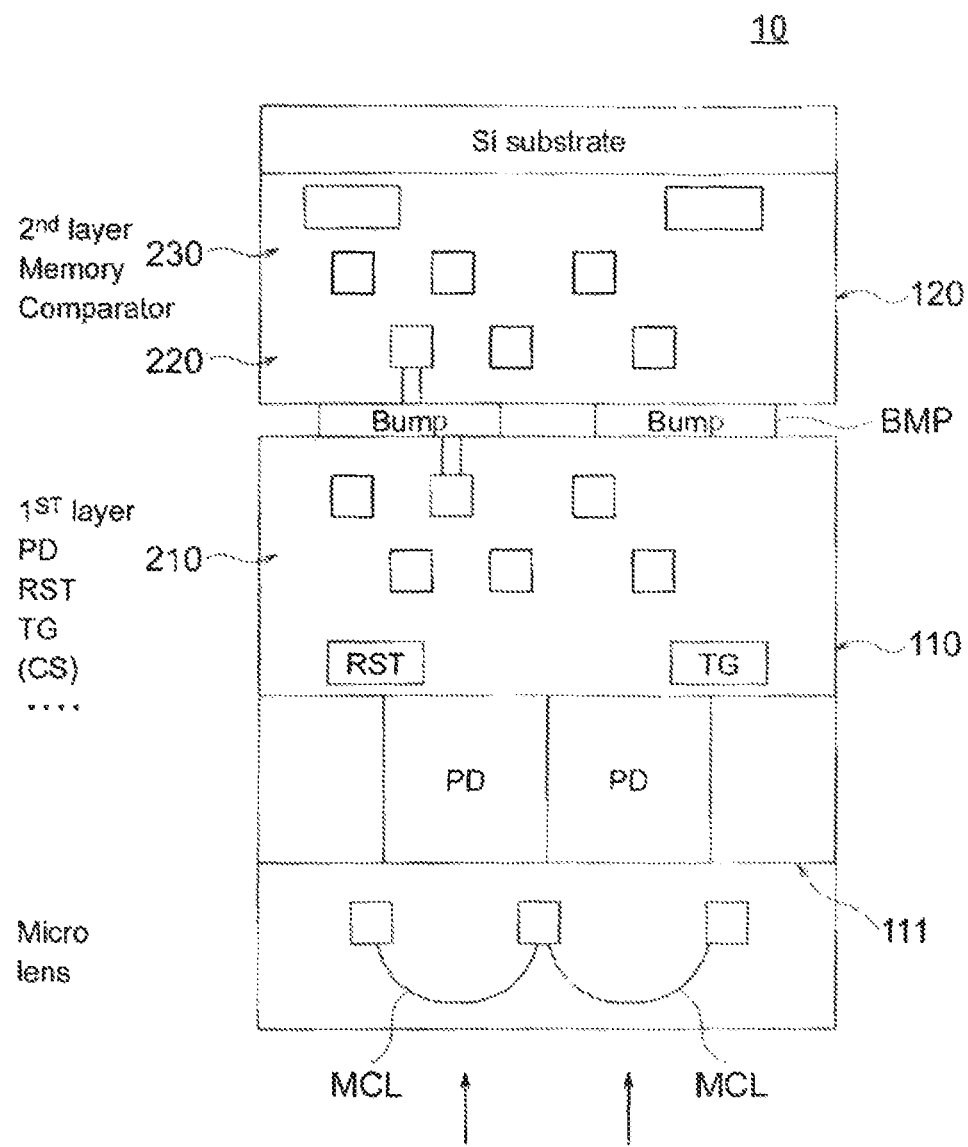
FIG. 12 is a schematic cross-sectional view for explaining the stacked structure of the solid-state imaging device according to the first embodiment.

FIG. 11A and FIG. 11B are schematic views for explaining the stacked structure of the solid-state imaging device 10 according to the first embodiment. FIG. 12 is also a schematic cross-sectional view for explaining the stacked structure of the solid-state imaging device 10 according to the first embodiment.

The solid-state imaging device 10 according to the first embodiment has a stacked structure of a first substrate (upper substrate) 110 and a second substrate (lower substrate) 120. The solid-state imaging device 10 is for example formed as an image capturing device having a stacked structure obtained by bonding the substrates to each other at a wafer level and cutting them by dicing. In the present example, the device is structured with the first substrate 110 stacked on the second substrate 120.

On the first substrate 110, photoelectric converting and reading parts 210 of the digital pixels 200 in the pixel part 20 are formed centered about its center part. The photodiodes PD are formed on the first surface 111 side of the first substrate 110 upon which the light L is incident. A microlens MCL and color filter are formed on that light incident side. On the second surface side of the first substrate 110, the transfer transistors TG1-Tr, reset transistors RST1-Tr, source follower transistors SF1-Tr, and current transistors IC1-Tr are formed.

In this way, in the first embodiment, basically the photoelectric converting and reading parts 210 in the digital pixels 200 are formed in a matrix on the first substrate 110.

AD conversion parts 220 and memory parts 230 in the digital pixels 200 are formed in a matrix on the second substrate 120. Further, the vertical scanning circuit 30, output circuit 40, and timing control circuit 50 may be formed on the second substrate 120 as well.

In such a stacked structure, the read-out node ND2 of each photoelectric converting and reading part 210 on the first substrate 110 and the inverted input terminal (−) of the comparator 221 in each digital pixel 200 on the second substrate 120 are, for example, as shown in FIG. 3, electrically connected by using the signal line LSG1, micro-bump BMP, and vias (die-to-die vias) etc. Further, in the present embodiment, the read-out node ND2 of each photoelectric converting and reading part 210 on the first substrate 110 and the inverted input terminal (−) of the comparator 221 in each digital pixel 200 on the second substrate 120 are AC-coupled by the coupling capacitor C221.

Read-Out Operation of Solid-State Imaging Device 10

The characteristic configurations and functions of the parts in the solid-state imaging device 10 were explained above. Next, an outline of the reading operation etc. of pixel signals of the digital pixels 200 in the solid-state imaging device 10 according to the first embodiment will be explained.

Figure 13:
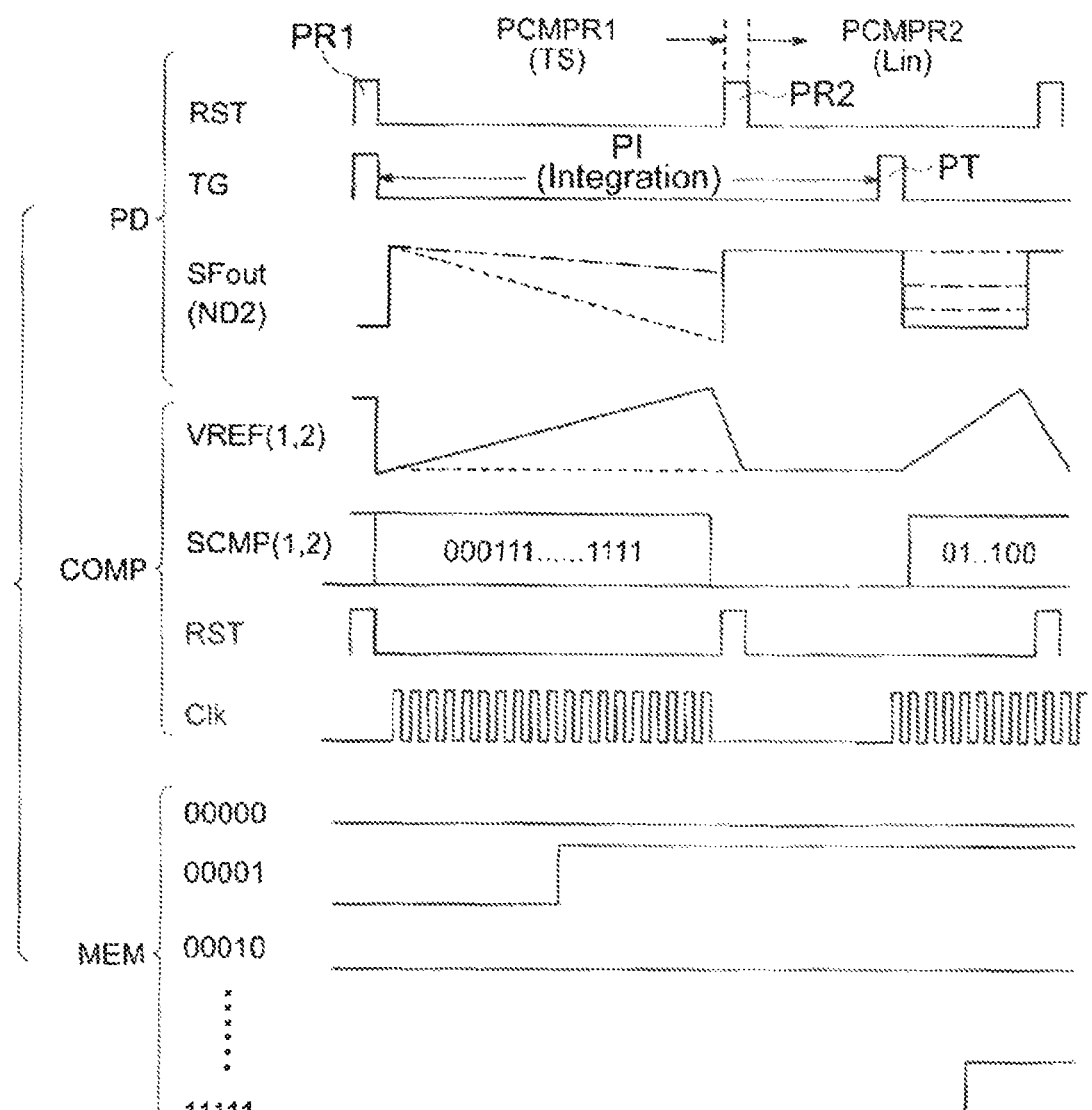
FIG. 13 is a timing chart for mainly explaining a reading operation in the pixel part at the time of a predetermined shutter mode in the solid-state imaging device according to the first embodiment.

FIG. 13 is a timing chart for mainly explaining the reading operation in the pixel part at the time of a predetermined shutter mode in the solid-state imaging device according to the first embodiment. FIG. 14A to FIG. 14D are views showing operation sequences and potential changes for mainly explaining the reading operation in the pixel part at the time of a predetermined shutter mode in the solid-state imaging device according to the first embodiment.

Figure 14:
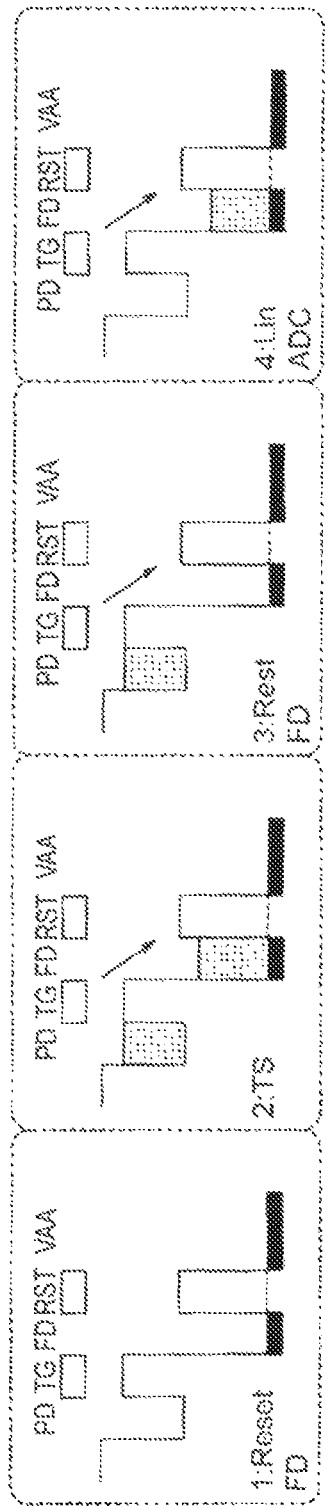
FIG. 14A to FIG. 14D are views showing operation sequences and potential changes for mainly explaining the reading operation in the pixel part at the time of a predetermined shutter mode in the solid-state imaging device according to the first embodiment.

First, at the start of a reading operation, as shown in FIG. 13 and FIG. 14A, a global reset resetting the photodiode PD1 and floating diffusion FD1 in each digital pixel 200 is carried out. In the global reset, in all of the pixels, simultaneously, the reset transistor RST1-Tr and transfer transistor TG1-Tr are held in the conductive state for a predetermined time period, and the photodiode PD1 and floating diffusion FD1 are reset. Further, in all of the pixels, simultaneously, the reset transistor RST1-Tr and transfer transistor TG1-Tr are switched to the non-conductive state, and exposure, that is, integration of charges, is started simultaneously and in parallel for all pixels.

Further, as shown in FIG. 13 and FIG. 14B, the operation of the time stamp (TS) ADC mode with respect to the overflow charges is started. The overflow charge is accumulated in the floating diffusion FD1 in the integration period PI. The time stamp (TS) ADC mode operates in the integration period PI, specifically, for a time period which is included in the integration period PI up to the reset of the floating diffusion FD1.

In the time stamp (TS) ADC mode, in the photoelectric converting and reading part 210, corresponding to the first comparison processing period PCMPR1 of the AD conversion part 220, a voltage signal VSL1 corresponding to the overflow charge overflowing from the photodiode PD1 to the output node of the floating diffusion FD1 in the integration period PI is output. Further, in the comparator 221 of the AD conversion part 220, the first comparison processing CMPR1 is carried out. In the comparator 221, under the control of the reading part 60, the digitalized first comparison result signal SCMP1 with respect to a voltage signal VSL1 corresponding to the overflow charge overflowing from the photodiode PD1 to the output node of the floating diffusion FD1 for the time period which is included in the integration period PI and continues up to when the floating diffusion FD1 is reset is output, and the digital data corresponding to the first comparison result signal SCNP1 is stored in the memory 231 in the memory part 230.

Next, as shown in FIG. 13 and FIG. 14C, the operation of the time stamp (TS) ADC mode with respect to the overflow charge ends, the operation changes to the linear ADC mode, and the reset period PR2 of the floating diffusion FD1 is shifted to. In the reset period PR2, the reset transistor RST1-Tr is held in the conductive state for a predetermined time period and the floating diffusion FD1 is reset. The signal (VRST) at the time of reset of the floating diffusion FD1 is read out and the digital signal is stored in the memory 232 of the memory part 230. Further, the reset transistor RST1-Tr is switched to the non-conductive state. In this case, the integration period PI is continued.

Next, as shown in FIG. 13 and FIG. 14D, the integration period PI ends, and the operation shifts to the transfer period PT. In the transfer period PT, the transfer transistor TG1-Tr is held in the conductive state for a predetermined time period, and the accumulated charge in the photodiode PD1 is transferred to the floating diffusion FD1.

In the linear (Lin) ADC mode, in the photoelectric converting and reading part 210, a voltage signal VSL2 corresponding to the accumulated charge which was transferred from the photodiode PD1 to the output node of the floating diffusion FD1 is output after the end of the integration period PI corresponding to the second comparison processing period PCMPR2 of the AD conversion part 220. Further, in the comparator 221 of the AD conversion part 220, the second comparison processing CPR2 is performed. In the comparator 221, under the control of the reading part 60 and after the integration period PI, a digitalized second comparison result signal SCMP2 with respect to a voltage signal VSL2 corresponding to the accumulated charge which was transferred from the photodiode PD1 to the output node of the floating diffusion FD1 is output, then digital data corresponding to the second comparison result signal SCP2 is stored in the memory 232 in the memory part 230.

The signal read out to the memory part 230 is executed by reading the digital signal data from the memory node and is sent through a buffer having such an MIPI data format, for example, an IO buffer 41 in the output circuit 40, the outside of the solid-state imaging device 10 (image sensor). This operation can be globally executed with respect to the entire pixel array.

As explained above, according to the first embodiment, the solid-state imaging device 10 is configured as for example a stacked type CMOS image sensor which, in the pixel part 20, includes photoelectric converting and reading parts 210, AD conversion parts 220, and memory parts 230 as digital pixels and has a global shutter operation function. In the solid-state imaging device 10 according to the first embodiment, each digital pixel 200 has an AD conversion function, while each AD conversion part 220 has a comparator 221 for performing comparison processing comparing a voltage signal read out by the photoelectric converting and reading part 210 and the reference voltage and outputting the digitalized comparison result signal. Further, the comparator 221, under the control of the reading part 60, performs first comparison processing CMPR1 outputting a digitalized first comparison result signal SCMP1 with respect to a voltage signal corresponding to the overflow charge overflowing from the photodiode PD1 to the output node (floating diffusion FD1) in the integration period and second comparison processing SCMP2 outputting a digitalized second comparison result signal SCMP2 with respect to a voltage signal corresponding to a accumulated charge of the photodiode PD1 transferred to the floating diffusion FD1 (output node) in the transfer period after the integration period.

Accordingly, according to the solid-state imaging device 10 of the first embodiment, the charge overflowing from the photodiode in the integration period is utilized in real time, therefore it becomes possible to realize a broader dynamic range and higher frame rate. Further, according to the present embodiment, it is possible to substantially realize a broader dynamic range and higher frame rate and, in addition, possible to lower noise, possible to expand the effective pixel region to the maximum limit, and possible to raise the value relative to the cost to the maximum limit.

Further, according to the solid-state imaging device 10 of the first embodiment, it is possible to prevent complication of the configuration while preventing a drop in the area efficiency in layout.

Further, the solid-state imaging device 10 according to the first embodiment has a stacked structure of the first substrate (upper substrate) 110 and second substrate (lower substrate) 120. Accordingly, in the first embodiment, basically, by forming the first substrate 110 side by only the NMOS system elements and by expanding the effective pixel region to the maximum limit by the pixel array, the value relative to the cost can be raised to the maximum limit.

Second Embodiment

Figure 15:
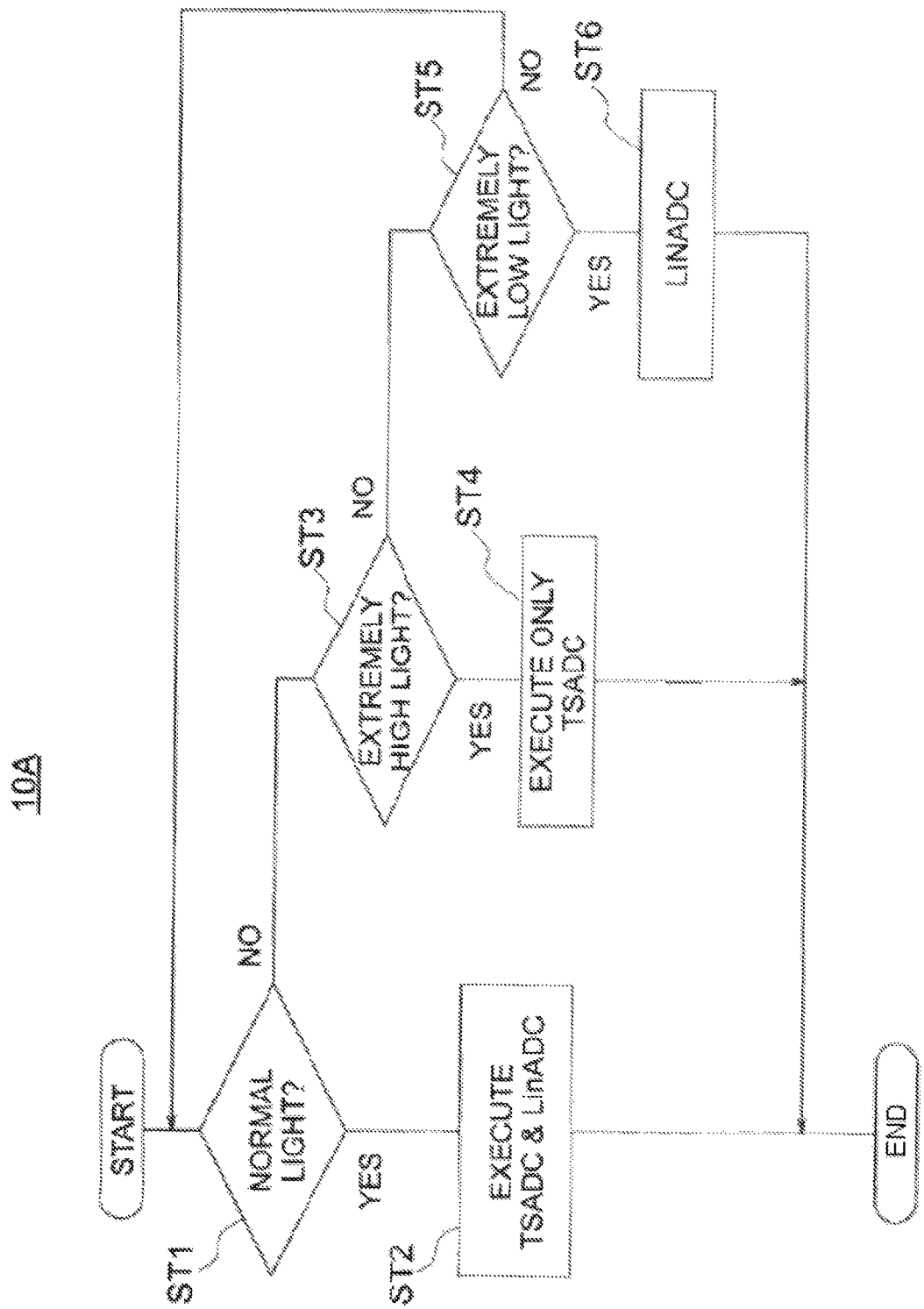
FIG. 15 is a view for explaining a solid-state imaging device according to a second embodiment of the present invention and showing an example of selection processing of a time stamp ADC mode operation and linear ADC mode operation.

FIG. 15 is a view for explaining a solid-state imaging device according to a second embodiment of the present invention and showing an example of processing for selection of the time stamp ADC mode operation and linear ADC mode operation.

The difference of a solid-state imaging device 10A according to the second embodiment from the solid-state imaging device 10 according to the first embodiment explained above is as follows. In the solid-state imaging device 10 according to the first embodiment, the time stamp (TS) ADC mode operation and linear (Lin) ADC mode operation are continuously carried out.

Contrary to this, in the solid-state imaging device 10A according to the second embodiment, the time stamp (TS) ADC mode operation and the linear (Lin) ADC mode operation can be selectively performed in accordance with the light intensity.

In the example in FIG. 15, in a case of normal light (ST1), the time stamp ADC mode operation and the linear (Lin) ADC mode operation are continuously carried out (ST2). In a case where the light is not normal, but is very (extremely) high (ST1, ST3), there is a high probability of overflow of the charge from the photodiode PD1 to the floating diffusion FD1, therefore only the time stamp ADC mode operation is carried out (ST4). In a case where the light is not normal, is not very (extremely) high either, but is very (extremely) low (ST1, ST3, ST5), the probability of overflow of the charge from the photodiode PD1 to the floating diffusion FD1 is extremely low, therefore only the linear (Lin) ADC mode operation is carried out (ST6).

According to the second embodiment, not only can the same effects as the effects by the first embodiment explained above be obtained, but also it becomes possible to achieve an increase in speed of the reading processing and lowering of the power consumption.

Third Embodiment

Figure 16:
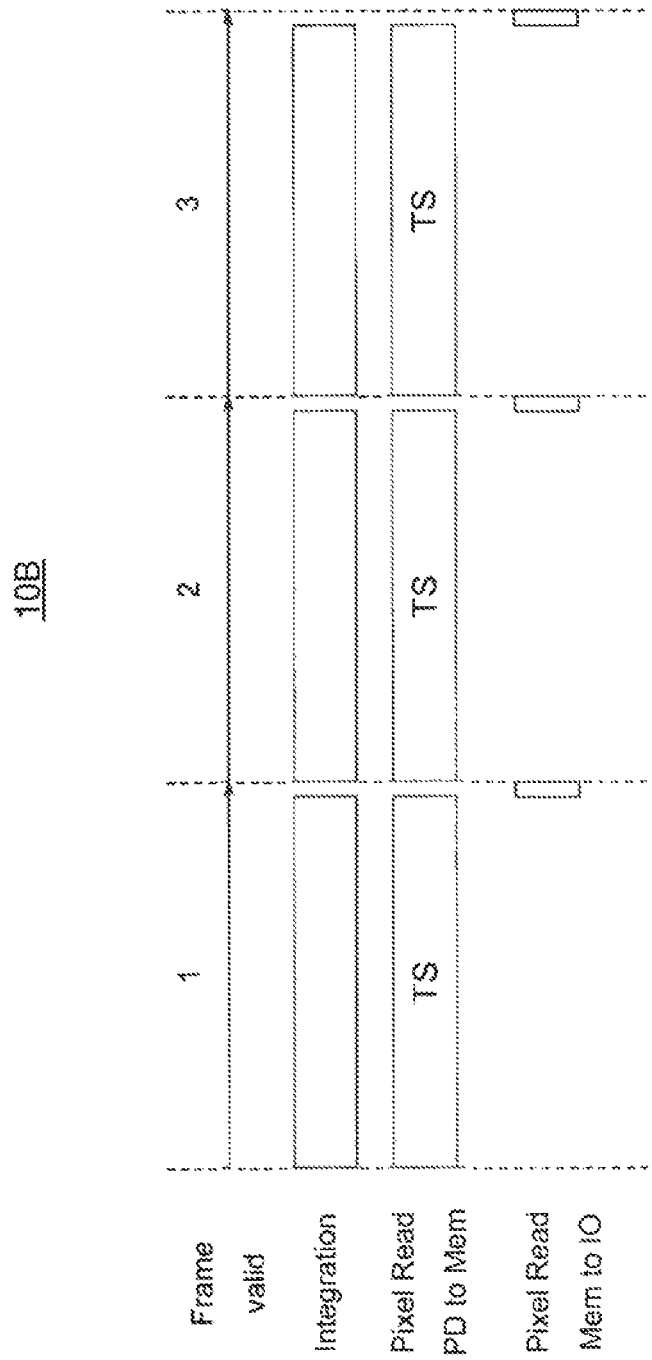
FIG. 16 is a view showing an example of the frame read out sequence in a solid-state imaging device according to a third embodiment of the present invention
Figure 17:
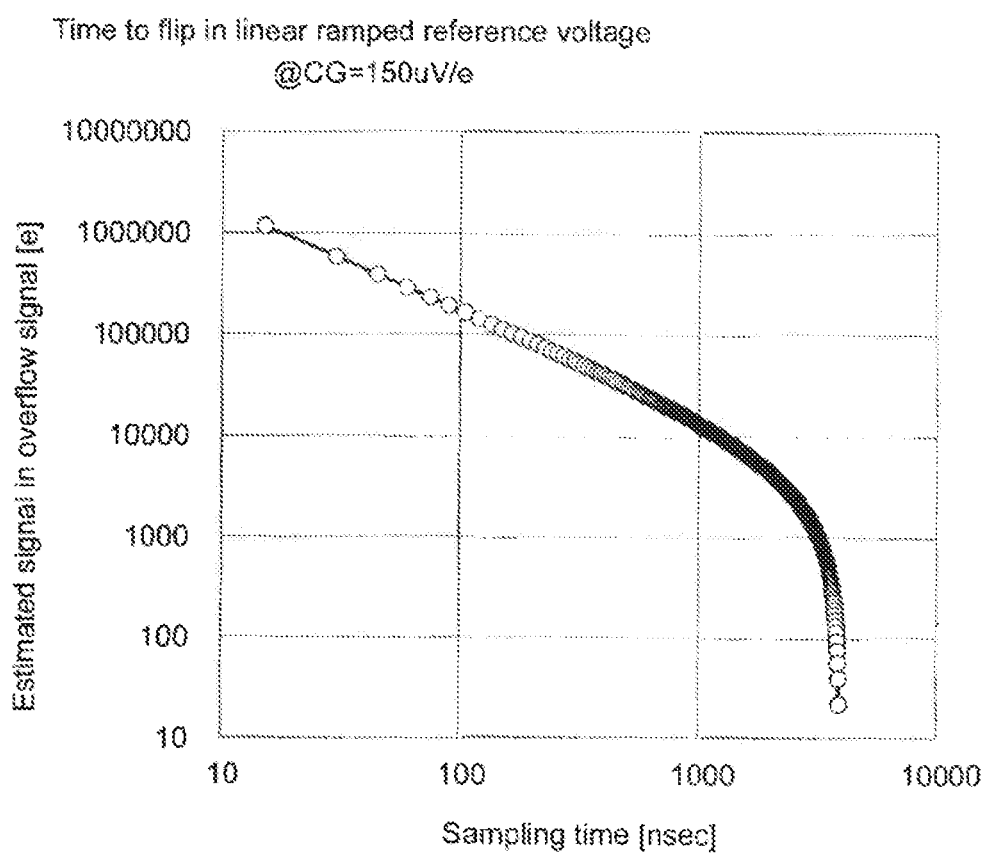
FIG. 17 is a view showing a state of light-to-time conversion where the reference voltage is input to the comparator according to the third embodiment.
Figure 18B:
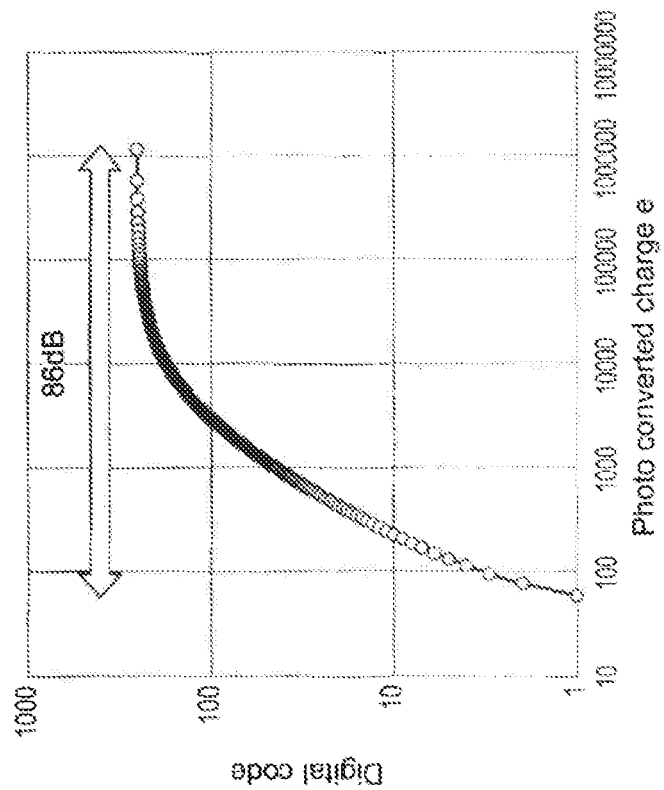
FIG. 18A and FIG. 18B are views showing relationships between a digital code and a quantity of the charge according to an optical conversion in the third embodiment.
Figure 18A:
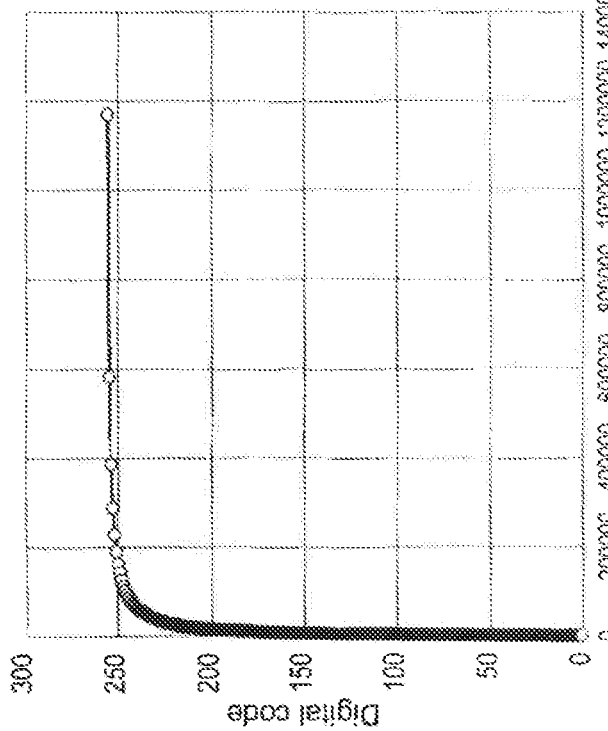

FIG. 16 is a view showing an example of a frame read out sequence in a solid-state imaging device 10B according to a third embodiment of the present invention. FIG. 17 is a view showing the state of light-to-time conversion where the reference voltage is input to the comparator according to the third embodiment. In FIG. 17, an abscissa indicates the sampling time, and an ordinate indicates the estimated signal in the overflow signal. Note that, the overflow signal referred to here is the signal estimated by rendering the transfer transistor TG1-Tr the conductive state to set the condition that the charge not be accumulated in the photodiode PD1 (non-overflowing). FIG. 17 indicates the sampling time at which the comparator 221 inverts which corresponds to the non-overflow charge (signal) according to the nature (suitability) of the light to be applied. FIG. 18A and FIG. 18B are views showing the relationships between the digital code and the quantity of the charge according to the optical conversion in the third embodiment. FIG. 18A shows the characteristics where use is made of a linear ramp signal, and FIG. 18B shows the characteristics where use is made of a log signal.

In the third embodiment, the reading part 60 controls the comparator 221 so as to output a digitalized first comparison result signal SCMP1 with respect to a voltage signal VSL corresponding to the charge according to the first comparison processing CMPR1 even in a case where the charge does not overflow from the photodiode PD1 to the output node of the floating diffusion FD1 in the integration period.

In the third embodiment, good conversion processing can be realized. According to a case, a dynamic range performance of 86 dB can be realized.

Fourth Embodiment

Figure 19:
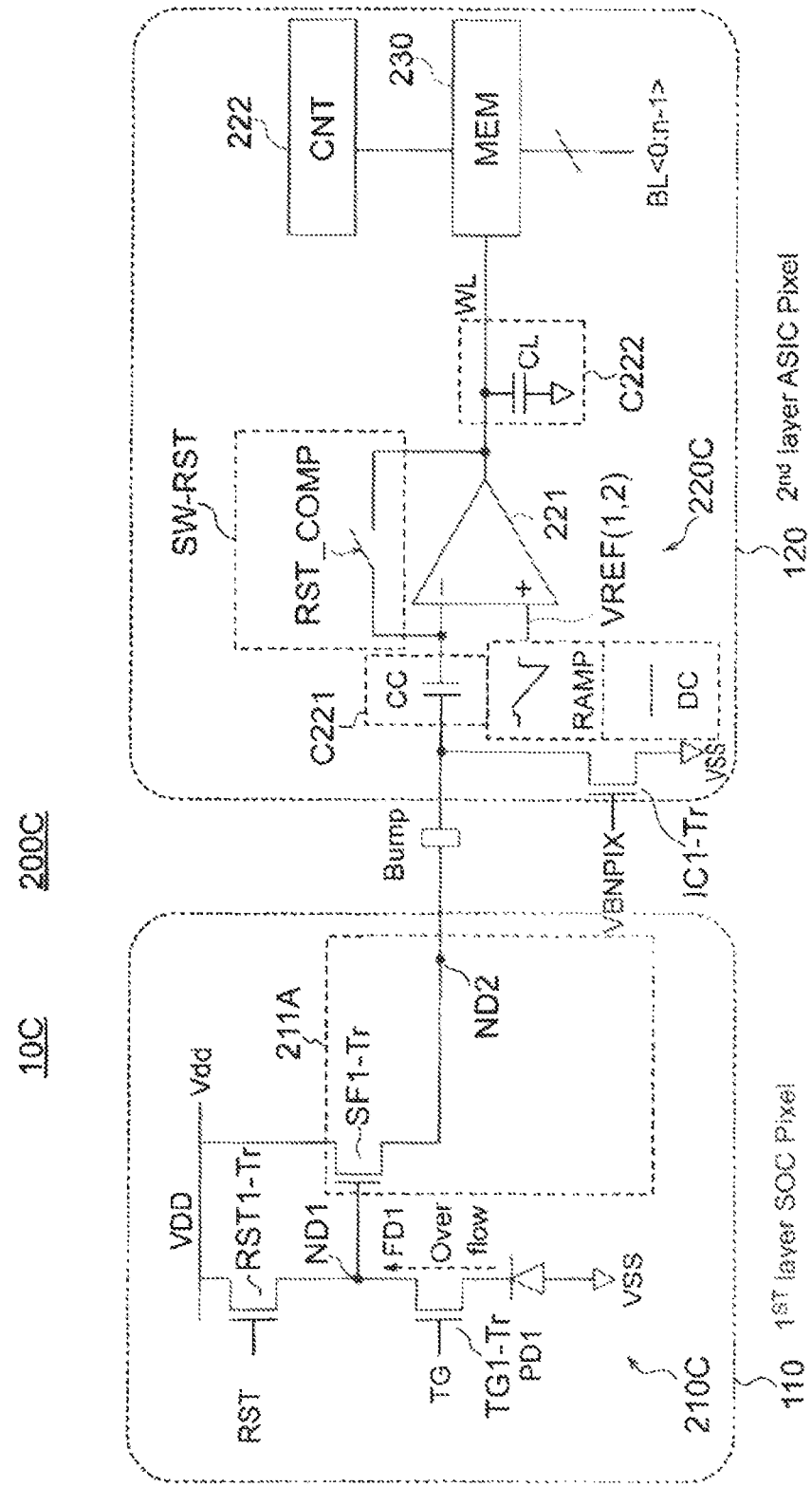
FIG. 19 is a circuit diagram showing an example of the pixel in a solid-state imaging device according to a fourth embodiment of the present invention.

FIG. 19 is a view showing an example of the configuration of a pixel in a solid-state imaging device according to a fourth embodiment of the present invention.

The difference of a solid-state imaging device 10C according to the fourth embodiment from the solid-state imaging device 10 according to the first embodiment explained above is as follows. In the solid-state imaging device 10C according to the fourth embodiment, the current source of the current transistor IC1-Tr is arranged not on the first substrate 110 side, but for example on the input side of the AD conversion part 220C on the second substrate 120 side.

According to the fourth embodiment, the same effects as the effects by the first embodiment explained above can be obtained.

Figure 20:
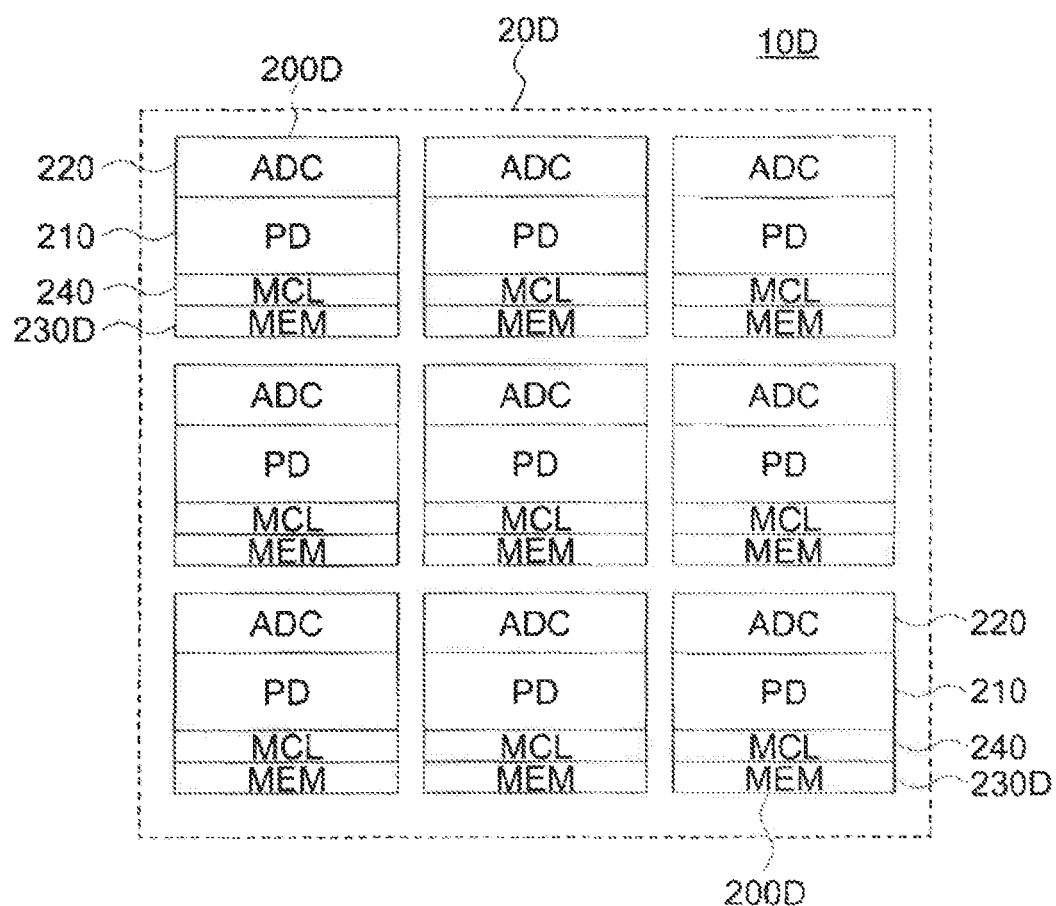
FIG. 20 is a view showing an example of a digital pixel array of a pixel part of a solid-state imaging device according to a fifth embodiment of the present invention.
Figure 21:
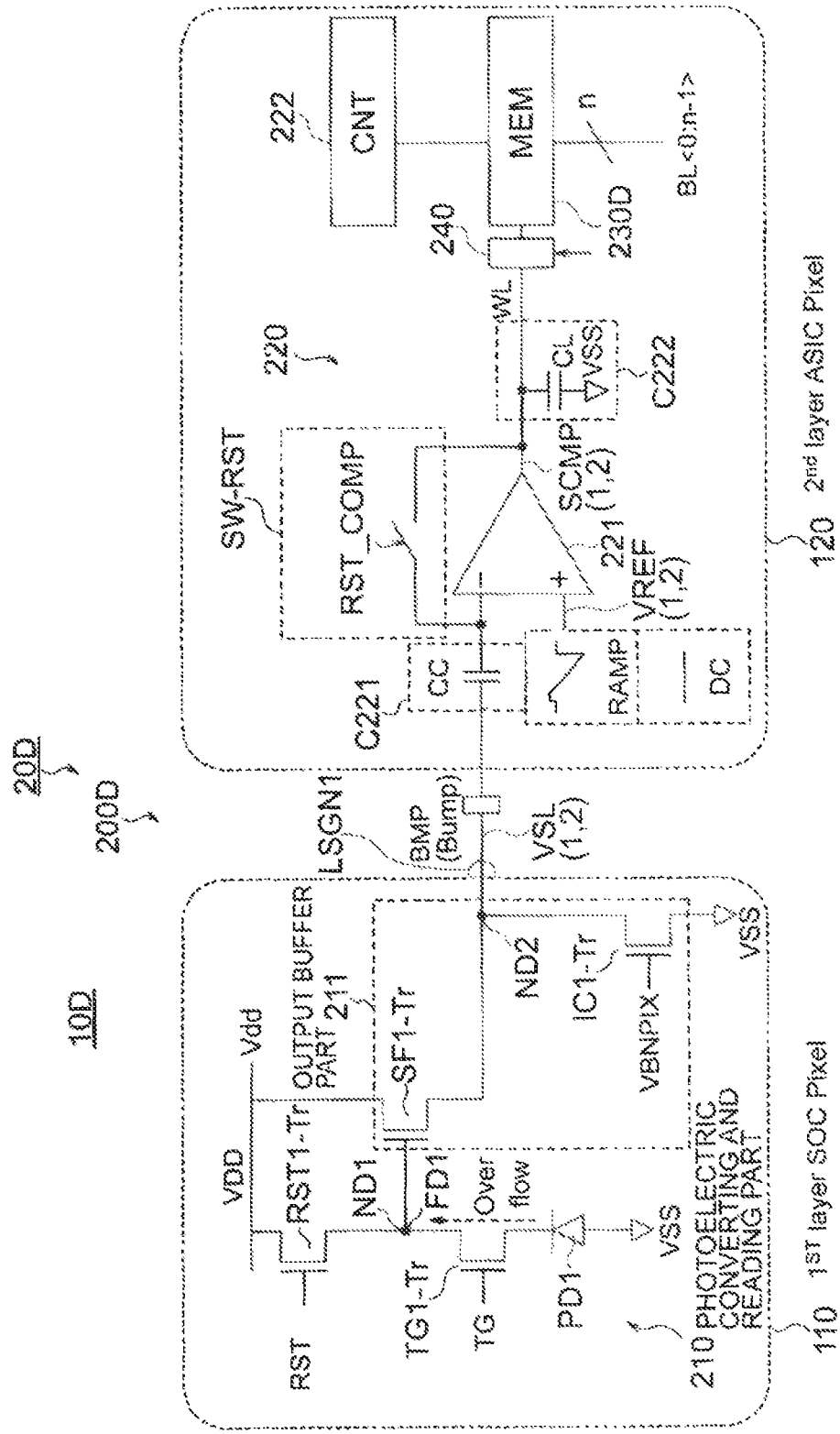
FIG. 21 is a circuit diagram showing an example of a pixel of the solid-state imaging device according to the fifth embodiment of the present invention.

Configurations of Pixel Part 20D and Digital Pixel 200D in Fifth Embodiment FIG. 20 is a view showing an example of a digital pixel array of the pixel part in a solid-state imaging device 10D according to a fifth embodiment of the present invention. FIG. 21 is a circuit diagram showing an example of a pixel in the solid-state imaging device 10D according to the fifth embodiment of the present invention.

A pixel 200D in the solid-state imaging device 10D according to the fifth embodiment is configured including a photoelectric converting and reading part (described as PD in FIG. 2 and FIG. 20) 210, AD conversion part (described as ADC in FIG. 2 and FIG. 20) 220, memory part (described as MEM in FIG. 2 and FIG. 20) 230D, and memory control part (described as MCL in FIG. 20) 240. The pixel part 20D in the fifth embodiment, as shown in FIG. 21, is configured as a stacked type CMOS image sensor configured by a first substrate 110 and second substrate 120. In the present example, as shown in FIG. 21, the photoelectric converting and reading part 210 is formed on the first substrate 110, while the AD conversion part 220, memory part 230D, and memory control part 240 are formed on the second substrate 120.

The reason for the pixel 200D in the solid-state imaging device 10D being provided with the memory control part 240 according to the fifth embodiment is as follows. As explained before, as the memory part 230 for storing the data after the AD conversion processing, a memory of n bits such as 8 bits or 12 bits becomes necessary. For example, when reading out pixel signals in a plurality of steps such as two steps, a capacity of 2n bits or the like in total becomes necessary. Further, when considering the digital CDS, a further larger capacity such as 4n bits becomes necessary. Accordingly, efficient access of the memory in accordance with the AD conversion processing becomes necessary. Therefore, in the solid-state imaging device 10D according to the fifth embodiment, provision is made of the memory control part 240 in the pixel 200D so that it is possible to substantially realize a broader dynamic range and higher frame rate, possible to obtain efficient access of the memory, and in addition possible to lower noise, possible to expand the effective pixel region to the maximum limit, and possible to raise the value relative to the cost to the maximum limit.

The memory control part 240 controls access to the memory part 240 in accordance with the state (level in the present embodiment) of the comparison result signal of the comparator 221. Further, the memory control part 240 controls whether to write data corresponding to the second comparison result signal SCP2 of the second comparison processing CMPR2 into the memory part 230D in accordance with the state of the first comparison result signal SCMP1 of the first comparison processing CMPR1. Specifically, the memory control part 240 prohibits the writing of data corresponding to the second comparison result signal SCMP2 of the second comparison processing CMPR2 into the memory part 230D if the level of the first comparison result signal SCMP1 of the first comparison processing CMPR1 changes from the first level to the second level in the first comparison processing period PCMPR1. On the other hand, the memory control part 240 permits the writing of data corresponding to the second comparison result signal SCMP2 of the second comparison processing CMPR2 into the memory part 230D if the level of the first comparison result signal SCMP1 of the first comparison processing CMPR1 remains the first level in the first comparison processing period PCMPR1.

In the pixel 200D in the solid-state imaging device 10D according to the fifth embodiment, the photoelectric converting and reading part 210 and AD conversion part 220 are the same as those in the first embodiment explained above, therefore a detailed explanation thereof is omitted. Below, the configurations and functions of the memory part 230D and memory control part 240 in the pixel 200D will be explained.

Configuration of Memory Part 230D

Figure 22:
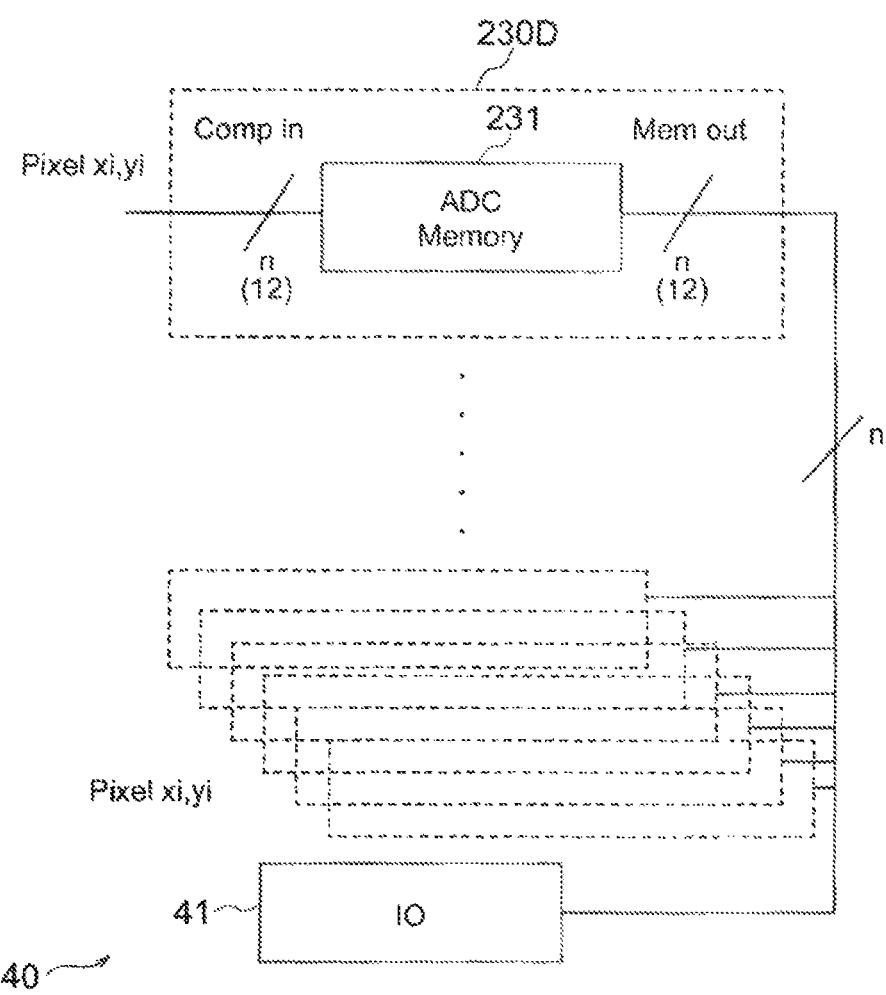
FIG. 22 is a view showing an example of the configurations of the memory part and output circuit according to the fifth embodiment of the present invention.

FIG. 22 is a view showing an example of the configurations of the memory part and output circuit according to the fifth embodiment of the present invention.

In the comparator 221, the first comparison result signal SCMP1 obtained by digitalization of a voltage signal corresponding to the overflow charge in the floating diffusion FD1 of the first comparison processing CMPR1 and the second comparison result signal SCMP2 obtained by digitalization of the accumulated charge in the photodiode PD1 of the second comparison processing CMPR2 are stored as digital data in the n-bit memory 231 in relation with each other. The memory 231 capable of sampling and holding n-bits of data in the memory part 230 is configured by an SRAM, DRAM, or the like. For example a digital-converted signal is supplied to this. It can handle a photo conversion code and can be read out by the external IO buffer 41 of the output circuit 40 on the periphery of the pixel array.

The memory 231 is controlled as to whether to enable memory access, specifically writing (over-writing), according to the output signal B of the memory control part 240 in accordance with the state (level in the present embodiment) of the comparison result signal of the comparator 221. The memory 231 is prohibited in writing (over-writing) when a signal B corresponding to the first comparison result signal SCMP1 of the first comparison processing CMPR1 is supplied at the first level (low level) while is permitted in writing (over-writing) when it is supplied at the second level (high level).

Note that, as the frame read out sequence in the solid-state imaging device 10D according to the fifth embodiment, the frame read out sequence in the solid-state imaging device 10 in the first embodiment explained with reference to FIG. 10 can be illustrated as an example. Accordingly, the explanation of the frame reading is omitted here.

Configuration and Function of Memory Control Part 240

The solid-state imaging device 10D in the fifth embodiment further has a memory control part 240 which controls access to the memory part 230D in accordance with the state (level in the present embodiment) of the comparison result signal of the comparator 221. Further, the memory control part 240 controls whether to write data corresponding to the second comparison result signal SCMP2 of the second comparison processing CMPR2 into the memory part 230D in accordance with the state of the first comparison result signal SCMP1 of the first comparison processing CMPR1. Specifically, the memory control part 240 prohibits the writing of data corresponding to the second comparison result signal SCMP2 of the second comparison processing CMPR2 into the memory part 230D if the level of the first comparison result signal SCMP1 of the first comparison processing CMPR1 changes from the first level (for example, low level) to the second level (high level) in the first comparison processing period PCMPR1. On the other hand, the memory control part 240 permits the writing of data corresponding to the second comparison result signal SCMP2 of the second comparison processing CPR2 into the memory part 230D if the level of the first comparison result signal SCMP1 of the first comparison processing CMPR1 remains the first level (low level) in the first comparison processing period PCMPR1.

Here, the reason for the provision of the memory control part 240 will be further explained below. At the time of the time stamp ADC mode, the change of the level of the first comparison result signal SCMP1 of the first comparison processing CMPR1 from the first level (for example low level) to the second level (high level) in the first comparison processing period PCMPR1 means the following. That is, in this case, light having a very (extremely) high illuminance (brightness) is irradiated to the photodiode PD1, and the photoelectrically converted charge overflows from the photodiode PD1 to the floating diffusion FD1 as the overflow charge, therefore a read-out signal of the linear ADC mode following the former is not necessary. Therefore, in this case, the memory control part 240 prohibits writing of data corresponding to the second comparison result signal SCMP2 of the second comparison processing CMPR2 into the memory part 230D (over-writing).

On the other hand, the fact that, in the time stamp ADC mode, the level of the first comparison result signal SCMP1 of the first comparison processing CMPR1 does not change from the first level (for example low level) to the second level (high level) in the first comparison processing period PCMPR1 means the following. That is, in this case, the probability that light from dark and low illuminance to normal illuminance with a medium brightness will be irradiated to the photodiode PD1 and that the photoelectrically converted charges will overflow as overflow charges from the photodiode PD1 to the floating diffusion FD1 is extremely low, therefore a read-out signal of the following linear ADC mode is necessary. Therefore, in this case, the memory control part 240 permits writing (over-writing) of the data corresponding to the second comparison result signal SCP2 of the second comparison processing CMPR2 into the memory part 230D.

Figure 23:
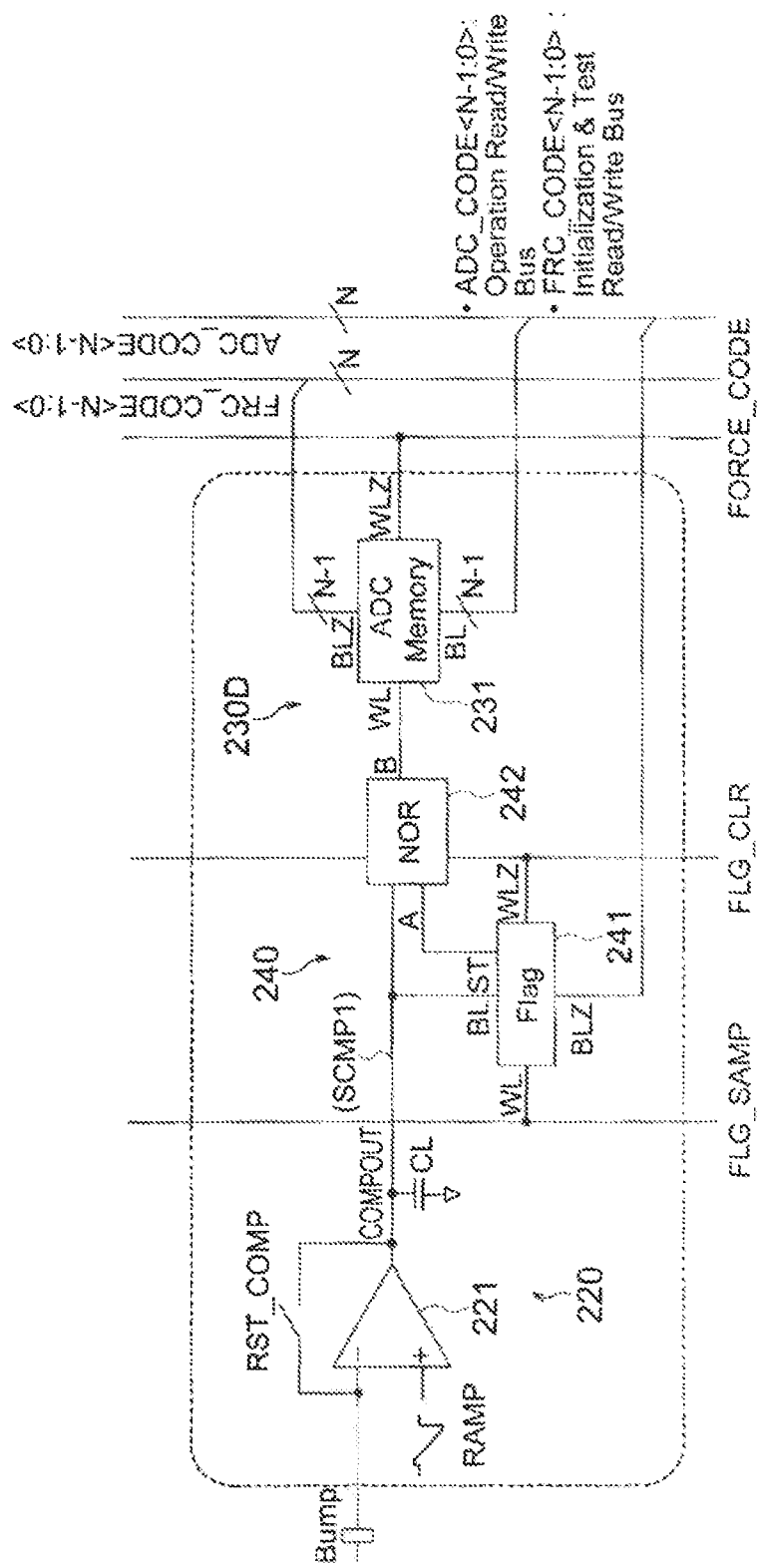
FIG. 23 is a view for explaining an example of the configuration of a memory control part according to the fifth embodiment of the present invention.

FIG. 23 is a view for explaining an example of the configuration of the memory control part 240 according to the fifth embodiment of the present invention. FIG. 24A to FIG. 24F are timing charts for explaining the operation in the memory control part when the output of the comparator inverts in the time stamp ADC mode. FIG. 25A to FIG. 25F are timing charts for explaining the operation in the memory control part when the output of the comparator does not invert in the time stamp ADC mode.

The memory control part 240 in FIG. 23 is configured including a flag bit memory cell (Flag) 241 and NOR circuit 242 as the gate circuit.

The flag bit memory cell 241 is supplied with a flag sampling signal FLG_SAMP and first comparison result signal SCMP1 of the first comparison processing CMPR1. If the level of the first comparison result signal SCMP1 of the first comparison processing CMPR1 has changed from the first level (low level) to the second level (high level) at the time when the flag sampling signal FLG_SAMP is supplied after the end of the first comparison processing period PCMPR1, the flag bit memory cell 241 sets the signal A at the second level (high level) and outputs the result to the NOR circuit 242. If the level of the first comparison result signal SCMP1 of the first comparison processing CMPR1 has not changed from the first level (low level) to the second level (high level) at the time when the flag sampling signal FLG_SAMP is supplied after the end of the first comparison processing period PCMPR1, the flag bit memory cell 241 sets the signal A at the first level (low level) and outputs the result to the NOR circuit 242.

The NOR circuit 242 is supplied with the output signal A from the flag bit memory cell 241 and the first comparison result signal SCMP1 of the first comparison processing CMPR1. When receiving as input the signal A at the second level (high level) in the state where the level of the first comparison result signal SCNP1 of the first comparison processing CMPR1 changes from the first level (low level) to the second level (high level), the NOR circuit 242 sets the signal B at the first level (low level), outputs the result to the memory part 230D, and prohibits writing (overwrite). When receiving as input the signal A at the first level (low level) in the state where the level of the first comparison result signal SCNP1 of the first comparison processing CMPR1 does not change from the first level (low level) to the second level (high level), the NOR circuit 242 sets the signal B at the second level (high level), outputs the result to the memory part 230D, and permits the writing (overwrite).

The flag bit memory cell 241 is a portion of the ADC memory 231, therefore does not have overhead in layout, so has a good area efficiency. Further, the NOR circuit 242 can be configured by the minimum size of four transistors (4T), therefore the overhead in the area may be the smallest. Further, by providing the memory control part 240, a single ADC memory is enough regardless of a two-step comparison processing being performed.

In the memory control part 240, as shown in FIG. 24A to FIG. 24F, if the level of the first comparison result signal SCMP1 according to the first comparison processing CMPR1 has changed from the first level (low level) to the second level (high level) at the time when the flag sampling signal FLG_SAMP is supplied after the end of the first comparison processing period PCMPR1, the output signal A of the flag bit memory cell 241 is input to the NOR circuit 242 at the second level (high level). In response to this, the signal B from the NOR circuit 242 is set at the first level (low level) and is output to the memory part 230D, whereupon writing (overwrite) is prohibited.

In the memory control part 240, as shown in FIG. 25A to FIG. 25F, if the level of the first comparison result signal SCMP1 according to the first comparison processing CMPR1 remains the first level (low level) at the time when the flag sampling signal FLG_SAMP is supplied after the end of the first comparison processing period PCMPR1, the output signal A of the flag bit memory cell 241 is input to the NOR circuit 242 at the first level (low level). In response to this, the signal B from the NOR circuit 242 is set at the second level (high level) and is output to the memory part 230D, whereupon writing (overwrite) is permitted.

Note that, the flag bit memory cell 241 and NOR circuit 242 are cleared to the initial state by a clear signal FLG_CLR after the end of the second comparison processing period PCMPR2 in the linear ADC mode.

Stacked Structure of Solid-State Imaging Device 10D

Next, the stacked structure of the solid-state imaging device 10D according to the fifth embodiment will be explained.

Figure 27:
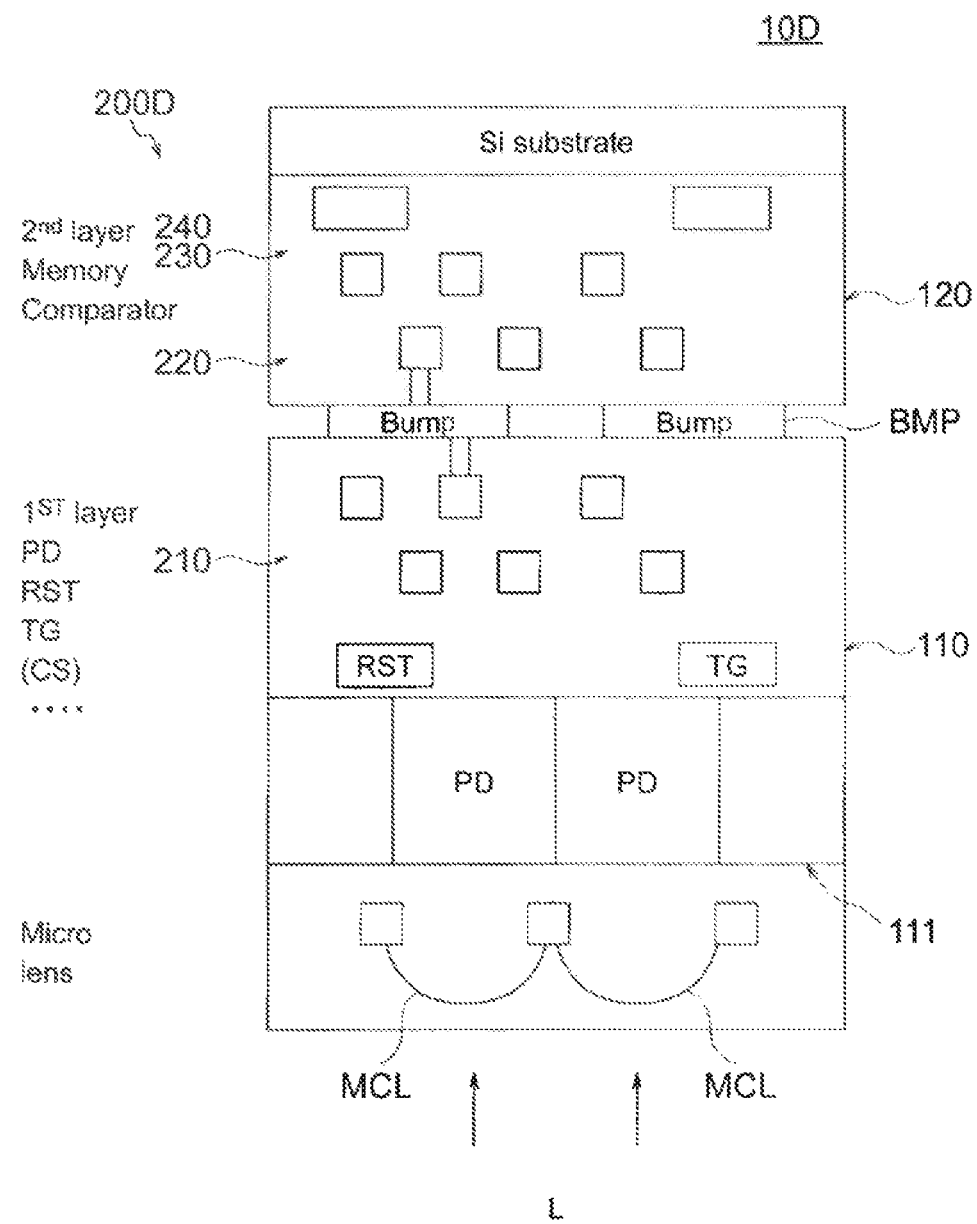
FIG. 27 is a schematic cross-sectional view for explaining the stacked structure of the solid-state imaging device according to the fifth embodiment.

FIG. 26A and FIG. 26B are schematic diagrams for explaining the stacked structure of the solid-state imaging device 10D according to the fifth embodiment. FIG. 27 is a schematic cross-sectional view for explaining the stacked structure of the solid-state imaging device 10D according to the fifth embodiment.

The solid-state imaging device 10D according to the fifth embodiment, in the same way as the solid-state imaging device 10 according to the first embodiment explained before, has a stacked structure of a first substrate (upper substrate) 110 and a second substrate (lower substrate) 120. The solid-state imaging device 10D is for example formed as an image capturing device having a stacked structure formed by bonding the substrates to each other at a wafer level and then cutting them by dicing. In the present example, the device is structured with the first substrate 110 stacked on the second substrate 120.

On the first substrate 110, photoelectric converting and reading parts 210 of the digital pixels 200D in the pixel part 20 are formed centered about its center part. The photodiodes PD are formed on the first surface 111 side of the first substrate 110 upon which the light L is incident. A microlens MCL and color filter are formed on that light incident side. On the second surface side of the first substrate 110, the transfer transistors TG1-Tr, reset transistors RST1-Tr, source follower transistors SF1-Tr, and current transistors IC1-Tr are formed.

In this way, in the fifth embodiment, basically the photoelectric converting and reading parts 210 in the digital pixels 200D are formed in a matrix on the first substrate 110.

AD conversion parts 220, memory parts 230, and memory control parts 240 in the digital pixels 200 are formed in a matrix on the second substrate 120. Further, the vertical scanning circuit 30, output circuit 40, and timing control circuit 50 may be formed on the second substrate 120 as well.

In such a stacked structure, the read-out node ND2 of each photoelectric converting and reading part 210 on the first substrate 110 and the inverted input terminal (−) of the comparator 221 in each digital pixel 200 on the second substrate 120 are electrically connected by using the signal line LSGN1, micro-bump BMP, and vias (die-to-die vias) etc. Further, in the present embodiment, the read-out node ND2 of each photoelectric converting and reading part 210 on the first substrate 110 and the inverted input terminal (−) of the comparator 221 in each digital pixel 200 on the second substrate 120 are AC-coupled by the coupling capacitor C221.

Reading Operation of Solid-State Imaging Device 10D

Next, the reading operation etc. of pixel signals of the digital pixels 200D in the solid-state imaging device 10D according to the fifth embodiment will be explained in detail.

Note that, basic reading operation timing, operation sequence, and potential changes are the same as those of the solid-state imaging device 10 in the first embodiment explained with reference to FIG. 13 and FIG. 14A to FIG. 14D. Accordingly, in the explanation here as well, FIG. 13 is used as the timing chart for mainly explaining the reading operation in the pixel part at the time of a predetermined shutter mode in the solid-state imaging device 10D according to the fifth embodiment, and FIG. 14A to FIG. 14D are used as the views showing the operation sequences and potential changes for mainly explaining the reading operation in the pixel part at the time of a predetermined shutter mode in the solid-state imaging device 10D according to the fifth embodiment.

First, at the start of a reading operation, as shown in FIG. 13 and FIG. 14A, a global reset resetting the photodiode PD1 and floating diffusion FD1 in each digital pixel 200D is carried out. In the global reset, in all of the pixels, simultaneously, the reset transistor RST1-Tr and transfer transistor TG1-Tr are held in the conductive state for a predetermined time period, and the photodiode PD1 and floating diffusion FD1 are reset. Further, in all of the pixels, simultaneously, the reset transistor RST1-Tr and transfer transistor TG1-Tr are switched to the non-conductive state, and exposure, that is, integration of charges, is started simultaneously and in parallel for all pixels.

Further, as shown in FIG. 13 and FIG. 14B, the operation of the time stamp (TS) ADC mode with respect to the overflow charges is started. The overflow charge is accumulated in the floating diffusion FD1 in the integration period PI. The time stamp (TS) ADC mode operates in the integration period PI, specifically, for a time period which is included in the integration period PI up to the reset of the floating diffusion FD1.

In the time stamp (TS) ADC mode, in the photoelectric converting and reading part 210, corresponding to the first comparison processing period PCMPR1 of the AD conversion part 220, a voltage signal VSL1 corresponding to the overflow charge overflowing from the photodiode PD1 to the output node of the floating diffusion FD1 in the integration period PI is output. Further, in the comparator 221 of the AD conversion part 220, the first comparison processing CMPR1 is carried out. In the comparator 221, under the control of the reading part 60, the digitalized first comparison result signal SCMP1 with respect to a voltage signal VSL1 corresponding to the overflow charge overflowing from the photodiode PD1 to the output node of the floating diffusion FD1 for the time period which is included in the integration period PI and continues up to when the floating diffusion FD1 is reset is output, and the digital data corresponding to the first comparison result signal SCNP1 is stored in the memory 231 in the memory part 230D.

Next, as shown in FIG. 13 and FIG. 14C, the operation of the time stamp (TS) ADC mode with respect to the overflow charge ends, the operation changes to the linear ADC mode, and the reset period PR2 of the floating diffusion FD1 is shifted to. In the reset period PR2, the reset transistor RST1-Tr is held in the conductive state for a predetermined time period and the floating diffusion FD1 is reset. The signal (VRST) at the time of reset of the floating diffusion FD1 is read out and the digital signal is stored in the memory 232 of the memory part 230D. Further, the reset transistor RST1-Tr is switched to the non-conductive state. In this case, the integration period PI is continued.

Next, as shown in FIG. 13 and FIG. 14D, the integration period PI ends, and the operation shifts to the transfer period PT. In the transfer period PT, the transfer transistor TG1-Tr is held in the conductive state for a predetermined time period, and the accumulated charge in the photodiode PD1 is transferred to the floating diffusion FD1.

In the linear (Lin) ADC mode, in the photoelectric converting and reading part 210, a voltage signal VSL2 corresponding to the accumulated charge which was transferred from the photodiode PD1 to the output node of the floating diffusion FD1 is output after the end of the integration period PI corresponding to the second comparison processing period PCMPR2 of the AD conversion part 220. Further, in the comparator 221 of the AD conversion part 220, the second comparison processing CMPR2 is performed. In the comparator 221, under the control of the reading part 60 and after the integration period PI, a digitalized second comparison result signal SCMP2 with respect to a voltage signal VSL2 corresponding to the accumulated charge which was transferred from the photodiode PD1 to the output node of the floating diffusion FD1 is output, then digital data corresponding to the second comparison result signal SCNP2 is stored in the memory 232 in the memory part 230D.

During the above processing, the memory control part 240 controls whether to write the data corresponding to the second comparison result signal SCMP2 of the second comparison processing CMPR2 into the memory part 230D in accordance with the state (output level) of the first comparison result signal SCMP1 of the first comparison processing CMPR1. Specifically, the memory control part 240 prohibits the writing of the data corresponding to the second comparison result signal SCMP2 of the second comparison processing CMPR2 into the memory part 230D if the level of the first comparison result signal SCMP1 of the first comparison processing CMPR1 changes from the first level (for example low level) to the second level (high level) in the first comparison processing period PCMPR1. On the other hand, the memory control part 240 permits the writing of the data corresponding to the second comparison result signal SCP2 of the second comparison processing CMPR2 into the memory part 230D if the level of the first comparison result signal SCMP1 of the first comparison processing CMPR1 remains the first level (low level) in the first comparison processing period PCMPR1.

The signal read out to the memory part 230D is executed by reading the digital signal data from the memory node and is sent through a buffer having such an MIPI data format, for example, an IO buffer 41 in the output circuit 40, the outside of the solid-state imaging device 10 (image sensor). This operation can be globally executed with respect to the entire pixel array.

As explained above, according to the fifth embodiment, the solid-state imaging device 10D is configured as for example a stacked type CMOS image sensor which, in the pixel part 20, includes photoelectric converting and reading parts 210, AD conversion parts 220, memory parts 230D, and memory control parts 240 as digital pixels and has a global shutter operation function. In the solid-state imaging device 10D according to the fifth embodiment, each digital pixel 200D has an AD conversion function, while each AD conversion part 220 has a comparator 221 for performing comparison processing comparing a voltage signal read out by the photoelectric converting and reading part 210 and the reference voltage and outputting the digitalized comparison result signal. Further, the comparator 221, under the control of the reading part 60, performs first comparison processing CMPR1 outputting a digitalized first comparison result signal SCMP1 with respect to a voltage signal corresponding to the overflow charge overflowing from the photodiode PD1 to the output node (floating diffusion FD1) in the integration period and second comparison processing SCMP2 outputting a digitalized second comparison result signal SCMP2 with respect to a voltage signal corresponding to a accumulated charge of the photodiode PD1 transferred to the floating diffusion FD1 (output node) in the transfer period after the integration period.

Further, the solid-state imaging device 10 has the memory control part 240 which controls access to the memory part in accordance with the state (level in the present embodiment) of the comparison result signal of the comparator 221. Further, the memory control part 240 controls whether to write the data corresponding to the second comparison result signal SCMP2 of the second comparison processing CMPR2 into the memory part 230D in accordance with the state (output level) of the first comparison result signal SCMP1 of the first comparison processing CMPR1. Specifically, the memory control part 240 prohibits the writing of the data corresponding to the second comparison result signal SCMP2 of the second comparison processing CMPR2 into the memory part 230D if the level of the first comparison result signal SCMP1 of the first comparison processing CMPR1 changes from the first level (for example low level) to the second level (high level) in the first comparison processing period PCMPR1. On the other hand, the memory control part 240 permits the writing of the data corresponding to the second comparison result signal SCMP2 of the second comparison processing CMPR2 into the memory part 230D if the level of the first comparison result signal SCP1 of the first comparison processing CMPR1 remains the first level (low level) in the first comparison processing period PCMPR1.

Accordingly, according to the solid-state imaging device 10D of the fifth embodiment, the charges overflowing from the photodiodes in the integration period are utilized in real time, therefore it is possible to realize a broader dynamic range and higher frame rate and in addition efficient access to the memory becomes possible. Further, according to the fifth embodiment, it is possible to substantially realize a broader dynamic range and higher frame rate, efficient access to the memory is possible, and, in addition, it is possible to lower noise, possible to expand the effective pixel region to the maximum limit, and possible to raise the value relative to the cost to the maximum limit.

Further, according to the solid-state imaging device 10D of the fifth embodiment, it is possible to prevent complication of the configuration while preventing a drop in the area efficiency in layout.

Further, the solid-state imaging device 10D according to the fifth embodiment has a stacked structure of the first substrate (upper substrate) 110 and second substrate (lower substrate) 120. Accordingly, in the fifth embodiment, basically, by forming the first substrate 110 side by only the NMOS system elements and by expanding the effective pixel region to the maximum limit by the pixel array, the value relative to the cost can be raised to the maximum limit.

Sixth Embodiment

Figure 28:
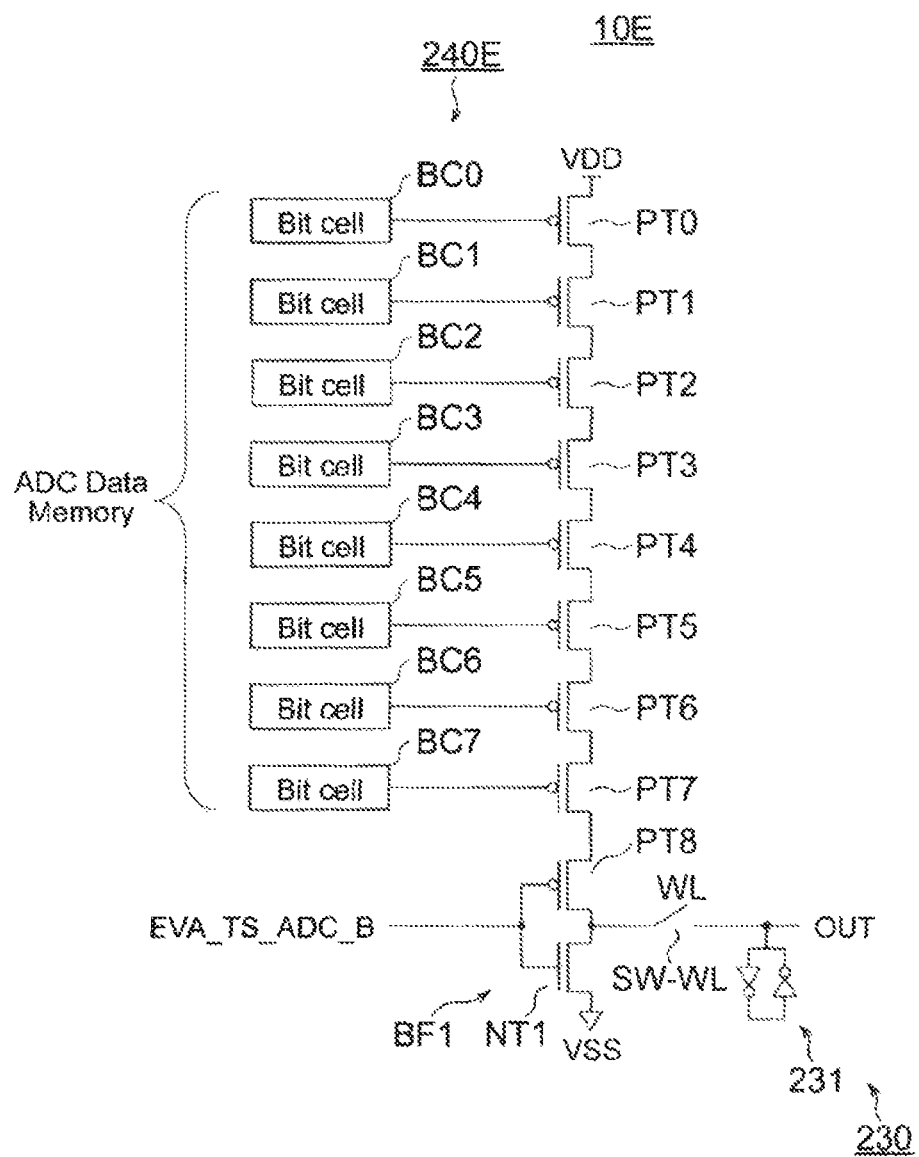
FIG. 28 is a view for explaining an example of the configuration of the memory control part according to a sixth embodiment of the present invention
Figure 29:
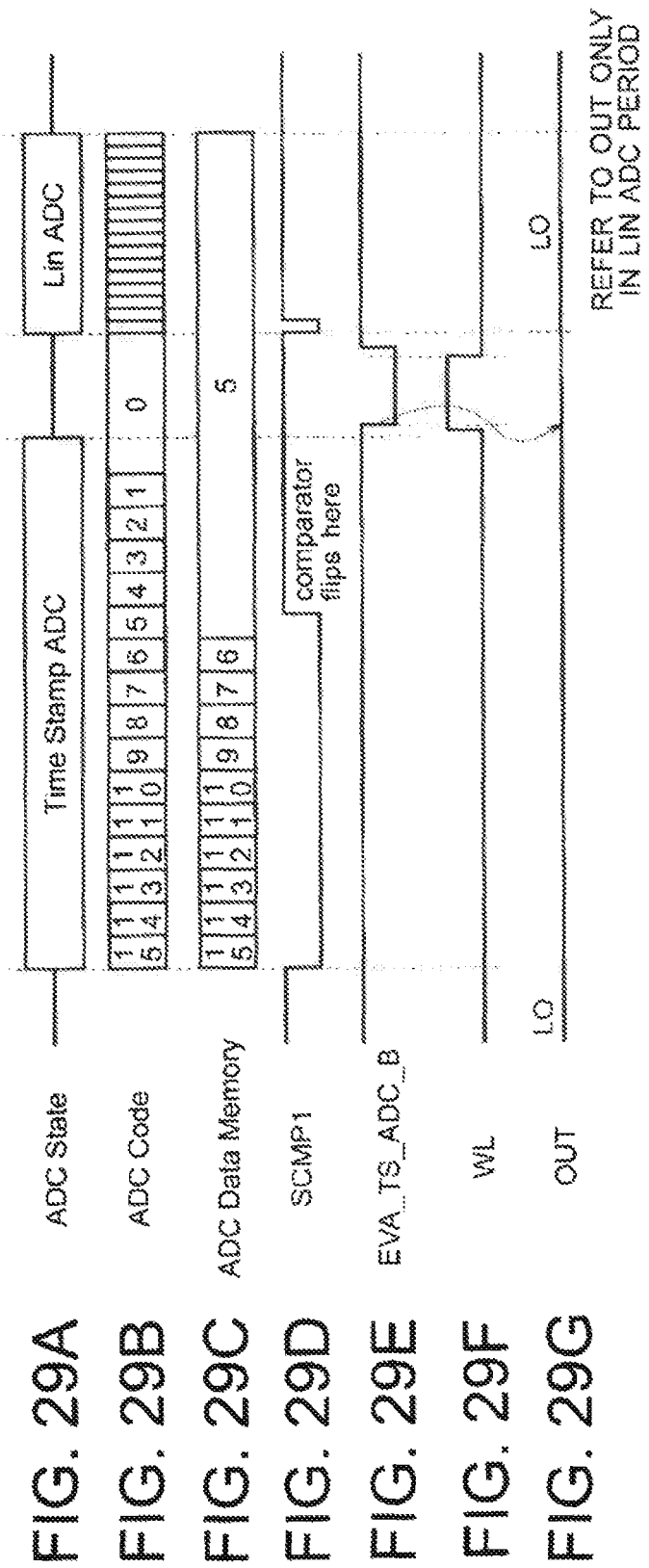
FIG. 29A to FIG. 29G are timing charts for explaining the operation in the memory control part in FIG. 28 where the output of the comparator inverts at the time of a time stamp ADC mode.
Figure 30:
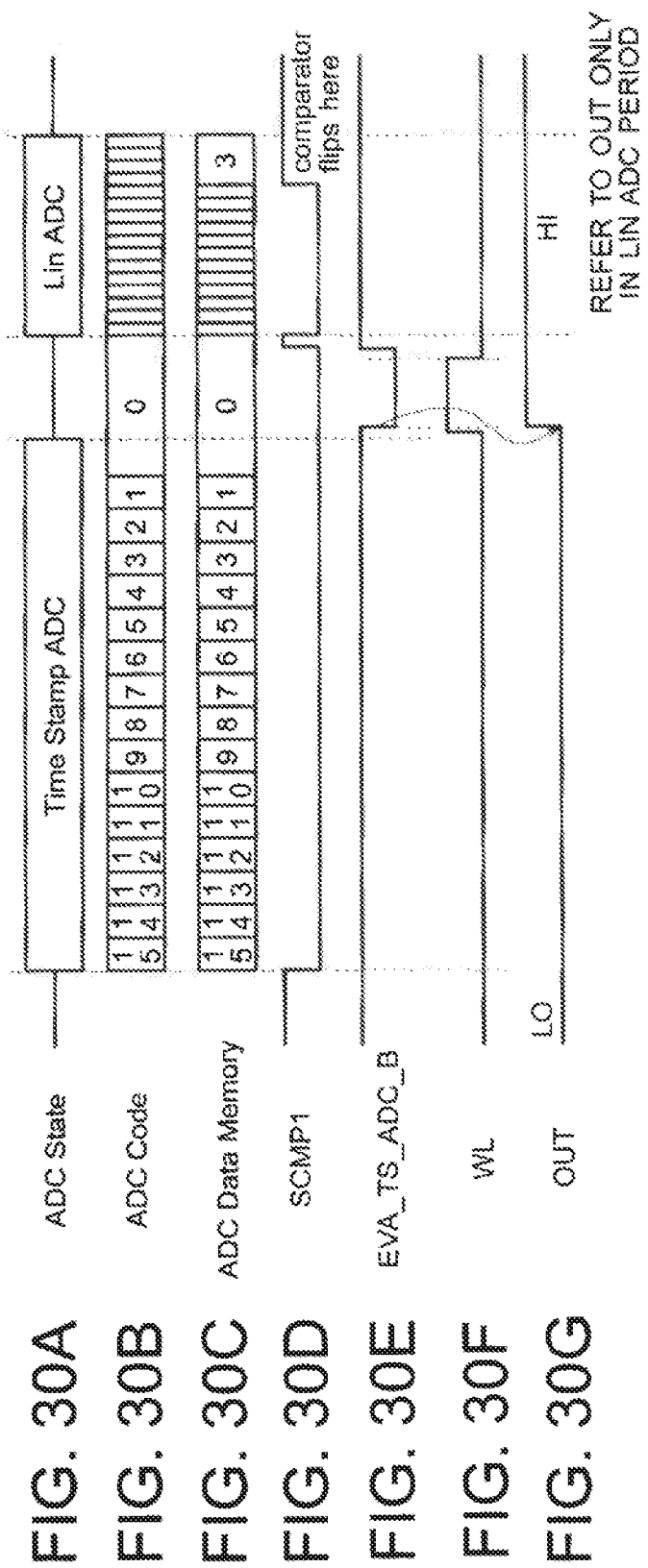
FIG. 30A to FIG. 30G are timing charts for explaining the operation in the memory control part in FIG. 28 where the output of the comparator does not invert at the time of a time stamp ADC mode.

FIG. 28 is a view for explaining an example of the configuration of a memory control part 240E in a solid-state imaging device 10E according to a sixth embodiment of the present invention. FIG. 29A to FIG. 29G are timing charts for explaining the operation in the memory control part in FIG. 28 where the output of the comparator inverts in the time stamp ADC mode. FIG. 30A to FIG. 30G are timing charts for explaining the operation in the memory control part in FIG. 28 where the output of the comparator does not invert in the time stamp ADC mode.

The memory control part 240E having the function as the memory evaluation part according to the sixth embodiment is for example configured by eight p-channel LDS (PMDS) transistors PT0 to PT7 corresponding to n bits, i.e. 8-digit bits in this example, which are connected in series between the power supply potential VDD and the reference potential VSS, a CMOS buffer BF1 which is comprised of a PMDS transistor PT8 and n-channel MOS (MDS) transistor NT1, and a switch SW-WL which controls electrical connection between the buffer BF1 and the memory part 230 according to the signal WL.

The gates of the PMOS transistors PT0 to PT7 are connected to the bit cells BC0 to BC7 of the memory 231 in the memory part 230. Further, the gates of the PMOS transistor PT8 and IDS transistor NT1 are connected to the supply line of the control signal EVA_TS_ADC_B as the sampling signal, and the signal OUT (signal corresponding to the signal B of the NOR circuit in FIG. 23) is output from the node at which the drains are connected to each other through the switch SW-WL to the memory 231.

In the memory control part 240E of FIG. 28, as described above, the electrical connection between the buffer BF 1 of the memory control part 240E and the memory part 230 is controlled by the signal WL. In the memory control part 240E of FIG. 28, This is evaluated when the control signal EVA_TS_ADC_B is a low level. If all the ADC data memories (the bit cells BC 0 to BC 7) are at the low level, the flag memory 231 is switched to the high level via the power supply potential VDD. This signal is valid when the LIN_ADC status signal, which is the ADC State, is high level, preventing the ADC data memory from being locked. If at least one of the bit cells BC 0 to BC 7 is at the high level, the power supply potential VDD is not connected, so the flag memory 231 keeps the low level. In that case, the ADC data memory is protected in the LIN_ADC state.

Note that, it is also effective that the transistors of the memory control part as the memory evaluation part and the NMOS version in which the polarities of all the signals are reversed.

In the memory control part 240E in the sixth embodiment, as shown in FIG. 29A to FIG. 29G, in the first comparison processing period PCMPR1, when the level of the first comparison result signal SCMP1 according to the first comparison processing CMPR1 changes from the first level (for example low level) to the second level (high level), that is, when the comparator 221 flips, the ADC data memory holds the value at that time. This is evaluated when the control signal EVA_TS_ADC_B is a low level. If the ADC data memory has any value other than 0, the signal OUT maintains the low level. If the signal OUT is a low level in the LIN ADC period, the ADC data memory is protected. At the time stamp ADC, the ADC data memory is updated irrespective of the state of the signal OUT.

On the other hand, in the memory control part 240E, as shown in FIG. 30A to FIG. 30G, in the first comparison processing period PCMPR1, when the level of the first comparison result signal SCMP1 according to the first comparison processing CMPR1 remains the first level (low level), that is, when the comparator 221 does not flip, the processing becomes as follows. This is evaluated when the control signal EVA_TS_ADC_B is the low level. If the ADC data memory is 0, the signal OUT maintains the high level. If the signal OUT is a high level in the LIN ADC period, the ADC data memory is overwritten. At the time stamp ADC, the ADC data memory is updated irrespective of the state of the signal OUT.

According to the sixth embodiment, not only can the same effects as the effects by the fifth embodiment explained above be obtained, but also it becomes possible to achieve an increase in speed of the read-out processing and lowering of the power consumption.

Seventh Embodiment

Figure 31:
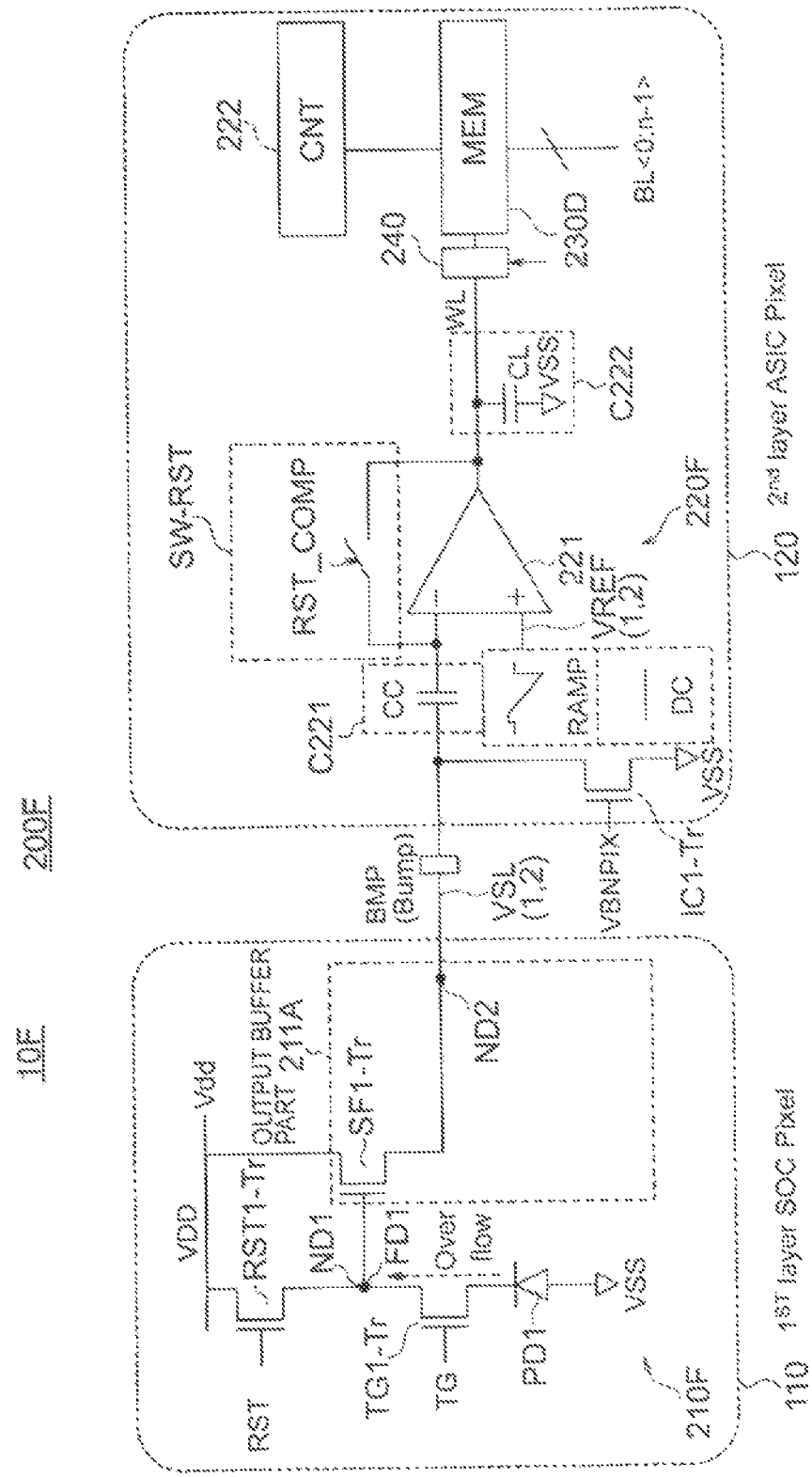
FIG. 31 is a circuit diagram showing an example of a pixel in a solid-state imaging device according to a seventh embodiment of the present invention.

FIG. 31 is a view showing an example of the configuration of a pixel in a solid-state imaging device according to a seventh embodiment of the present invention.

The difference of a solid-state imaging device 10F according to the seventh embodiment from the solid-state imaging device 10D according to the fifth embodiment explained above is as follows. In the solid-state imaging device 10F according to the seventh embodiment, the current source of the current transistor IC1-Tr is arranged not on the first substrate 110 side, but on for example the input side of the AD conversion part 220 on the second substrate 120 side.

According to the seventh embodiment, the same effects as the effects by the fifth embodiment explained above can be obtained.

The solid-state imaging devices 10, 10A, 10B, 10C, 10D, 10E, and 10F explained above can be applied, as image capturing devices, to digital cameras, video cameras, portable terminals, or monitoring cameras, cameras for medical endoscopes, and other electronic apparatuses.

Figure 32:
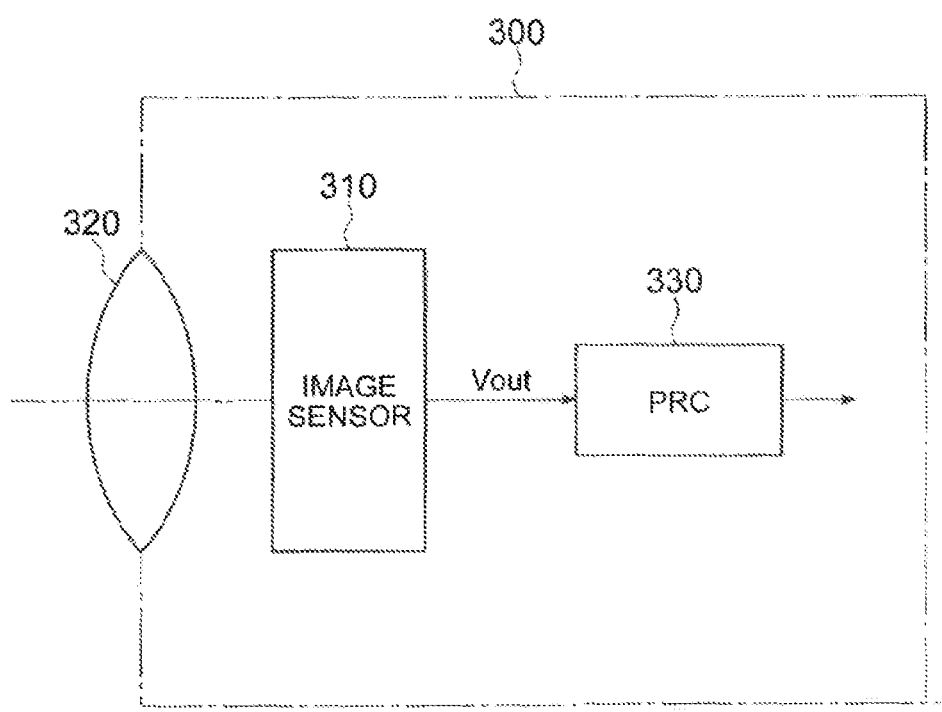
FIG. 32 is a view showing an example of the configuration of an electronic apparatus to which a solid-state imaging device according to an embodiment of the present invention is applied.

FIG. 32 is a view showing an example of the configuration of an electronic apparatus mounting a camera system to which the solid-state imaging device according to an embodiment of the present invention is applied.

The electronic apparatus 300, as shown in FIG. 32, has a CMOS image sensor 310 to which the solid-state imaging devices 10, 10A, 10B, 10C, 10D, 10E, and 10F according to the present embodiments can be applied. Further, the electronic apparatus 300 has an optical system (lens etc.) 320 which guides an incident light (forms a subject image) into a pixel region of this CMOS image sensor 310. The electronic apparatus 300 has a signal processing circuit (PRC) 330 for processing the output signals of the CMOS image sensor 310.

The signal processing circuit 330 applies predetermined signal processing with respect to the output signals of the CMOS image sensor 310. The image signal processed in the signal processing circuit 330 can be projected as a moving image onto a monitor formed by a liquid crystal display or the like or can be output to a printer. Further, it can be directly recorded in a recording medium such as a memory card. Various embodiments are possible.

As explained above, by mounting the solid-state imaging devices 10, 10A, 10B, 10C, 10D, 10E, and 10F explained before as the CMOS image sensors 310, it becomes possible to provide high performance, small-sized, and low cost camera systems. Further, it is possible to realize for example monitoring cameras or cameras for medical endoscopes or other electronic apparatuses which are used for applications where there are restrictions in mounting size, number of connectable cables, cable length, installation height, etc. in requirements for camera installation.

What is claimed is:

1. A solid-state imaging device, comprising
a pixel part in which pixels for performing photoelectric conversion are arranged and
a reading part for reading out pixel signals from the pixels in the pixel part, wherein
each pixel includes
a photoelectric conversion element which accumulates a charge generated by photoelectric conversion in an integration period,
a transfer element capable of transferring the charge accumulated in the photoelectric conversion element in a transfer period after the integration period,
an output node to which the charge accumulated in the photoelectric conversion element is transferred through the transfer element,
an output buffer part which converts the charge at the output node to a voltage signal corresponding to a quantity of the charge and outputs the converted voltage signal, and
a comparator which performs comparison processing comparing the voltage signal from the output buffer part and a reference voltage and outputting a digitalized comparison result signal and wherein
the comparator, under the control of the reading part, performs
first comparison processing for outputting a digitalized first comparison result signal with respect to a voltage signal corresponding to an overflow charge overflowing from the photoelectric conversion element to the output node in the integration period and
second comparison processing for outputting a digitalized second comparison result signal with respect to the a voltage signal corresponding to an accumulated charge of the photoelectric conversion element transferred to the output node in the transfer period after the integration period.

2. The solid-state imaging device according to claim 1, wherein
the comparator, in the first comparison processing, outputs the first comparison result signal corresponding to time corresponding to a quantity of the overflow charge.

3. The solid-state imaging device according to claim 2, wherein
the comparator, in the first comparison processing, can deal with a light level from a signal level of the photoelectric conversion element at maximum sampling time at which the overflow charge begins to overflow from the photoelectric conversion element to the output node up to a signal level obtained at minimum sampling time.

4. The solid-state imaging device according to claim 1, wherein:
the integration period is a period from when the photoelectric conversion element and the output node are reset to a reset level to when the transfer element is switched to a conductive state and the transfer period is started, and a period of the first comparison processing is a period from a start of resetting of the photoelectric conversion element and the output node to the reset level up to when the output node is reset to the reset level before a start of the transfer period, and
a period of the second comparison processing is a period after the output node is reset to the reset level and is a period including a period after the transfer period.

5. The solid-state imaging device according to claim 1, wherein
the reading part performs control so that the first comparison processing and the second comparison processing are selectively performed in accordance with a light intensity.

6. The solid-state imaging device according to claim 5, wherein
the reading part performs control so as to perform the first comparison processing and the second comparison processing in a case of normal light.

7. The solid-state imaging device according to claim 5, wherein
the reading part performs control so as to perform the first comparison processing in a case of higher light than normal light.

8. The solid-state imaging device according to claim 5, wherein
the reading part performs control so as to perform the second comparison processing in a case of lower light than normal light.

9. The solid-state imaging device according to claim 5, wherein
the reading part changes the reference voltage while sampling the levels of the output node in accordance with the light intensity throughout the integration period.

10. The solid-state imaging device according to claim 9, wherein
the reading part makes the reference voltage linearly change relative to a sampling interval in accordance with desired characteristics throughout the integration period.

11. The solid-state imaging device according to claim 9, wherein
the reading part makes the reference voltage non-linearly change relative to a sampling interval in accordance with desired characteristics throughout the integration period.

12. The solid-state imaging device according to claim 1, wherein
the reading part controls the comparator so as to output the digitalized first comparison result signal with respect to a voltage signal corresponding to the charge by the first comparison processing even in a case where the charge does not overflow from the photoelectric conversion element to the output node in the integration period.

13. The solid-state imaging device according to claim 1, wherein
each pixel includes
an output node of a floating diffusion and
a reset element resetting the floating diffusion to a predetermined potential in a reset period, and
the output buffer part includes
a source follower element converting the charge in the floating diffusion to a voltage signal corresponding to the quantity of the charge and outputting the converted signal and a current source connected to a source of the source follower element.

14. The solid-state imaging device according to claim 1, wherein
in the comparator,
the voltage signal of the output buffer part is supplied to a first input terminal,
the reference voltage is supplied to a second input terminal, and
a coupling capacitor is connected to a supply line of the voltage signal to the first input terminal.

15. The solid-state imaging device according to claim 14, wherein
in the comparator,
a reset switch is connected between an output terminal and the first input terminal, and
a load capacitor is connected to an output terminal side.

16. The solid-state imaging device according to claim 1, wherein
the device includes
a first substrate and
a second substrate,
each pixel includes a memory part for storing data corresponding to the comparison result signal of the comparator,
the first substrate and the second substrate have a stacked structure in which these substrates are connected through a connection part,
at least the photoelectric conversion element, transfer element, output node, and output buffer part of the pixel are formed on the first substrate, and
at least the comparator, memory part, and at least a portion of the reading part are formed on the second substrate.

17. The solid-state imaging device according to claim 16, wherein
each pixel includes
an output node of a floating diffusion and
a reset element which resets the floating diffusion to a predetermined potential in a reset period,
the output buffer part includes
a source follower element which converts the charge in the floating diffusion to a voltage signal corresponding to the quantity of the charge and outputs the converted signal and
a current source connected to a source of the source follower element,
the floating diffusion, reset element, and source follower element are formed on the first substrate, and
the current source is formed on the first substrate or the second substrate.

18. The solid-state imaging device according to claim 1, wherein
each pixel includes
a memory part capable of storing data corresponding to the comparison result signal of the comparator and
a memory control part for controlling access to the memory part in accordance with a state of the comparison result signal of the comparator,
the comparator, under the control of the reading part, can perform
first comparison processing for outputting a digitalized first comparison result signal with respect to a voltage signal corresponding to an overflow charge overflowing from the photoelectric conversion element to the output node in the integration period and
second comparison processing for outputting a digitalized second comparison result signal with respect to a voltage signal corresponding to an accumulated charge of the photoelectric conversion element transferred to the output node in the transfer period after the integration period, and
the memory control part controls whether to write data corresponding to the second comparison result signal of the second comparison processing into the memory part in accordance with a state of the first comparison result signal of the first comparison processing.

19. The solid-state imaging device according to claim 18, wherein
the memory control part prohibits the writing of the data corresponding to the second comparison result signal of the second comparison processing into the memory part when a level of the first comparison result signal of the first comparison processing changes from a first level to a second level in a first comparison processing period.

20. The solid-state imaging device according to claim 18, wherein
the memory control part permits the writing of the data corresponding to the second comparison result signal of the second comparison processing into the memory part when a level of the first comparison result signal of the first comparison processing remains a first level in a first comparison processing period.

21. The solid-state imaging device according to claim 18, wherein
the writing into the memory part is prohibited if the signal corresponding to the first comparison result signal of the first comparison processing is supplied at a first level, and it is permitted if supplied at a second level, and
the memory control part
prohibits the writing of the data corresponding to the second comparison result signal of the second comparison processing into the memory part if a level of the first comparison result signal of the first comparison processing changes from the first level to the second level in a first comparison processing period and permits the writing of the data corresponding to the second comparison result signal of the second comparison processing into the memory part if the level of the first comparison result signal of the first comparison processing remains the first level,
supplies the signal corresponding to the first comparison result signal to the memory part at the first level if the level of the first comparison result signal of the first comparison processing has changed from the first level to the second level at the time when a sampling signal is supplied after an end of the first comparison processing period, and
supplies the signal corresponding to the first comparison result signal to the memory part at the second level if the level of the first comparison result signal of the first comparison processing remains the first level at the time when the sampling signal is supplied after the end of the first comparison processing period.

22. The solid-state imaging device according to claim 18, wherein
the device includes
a first substrate and
a second substrate,
the first substrate and the second substrate have a stacked structure in which these substrates are connected through a connection part, at least the photoelectric conversion element, transfer element, output node, and output buffer part of the pixel are formed on the first substrate, and, at least the comparator, memory part, and at least a portion of the reading part are formed on the second substrate.

23. The solid-state imaging device according to claim 22, wherein each pixel includes an output node of a floating diffusion and a reset element which resets the floating diffusion to a predetermined potential in a reset period, the output buffer part includes a source follower element which converts the charge in the floating diffusion to a voltage signal corresponding to the quantity of the charge and outputs the converted signal and a current source connected to a source of the source follower element, the floating diffusion, reset element, and source follower element are formed on the first substrate, and the current source is formed on the first substrate or the second substrate.

24. A method for driving a solid-state imaging device having a pixel part in which pixels for performing photoelectric conversion are arranged and a reading part for reading out pixel signals from the pixels in the pixel part, wherein each pixel includes a photoelectric conversion element which accumulates a charge generated by photoelectric conversion in an integration period, a transfer element capable of transferring the charge accumulated in the photoelectric conversion element in a transfer period after the integration period, an output node to which the charge accumulated in the photoelectric conversion element is transferred through the transfer element, an output buffer part which converts the charge at the output node to a voltage signal corresponding to a quantity of the charge and outputs the converted voltage signal, and a comparator which performs comparison processing for comparing the voltage signal from the output buffer part and a reference voltage and outputting a digitalized comparison result signal which method for driving a solid-state imaging device, when reading out a pixel signal of the pixel, comprising the steps of, in the comparator, under the control of the reading part, performing first comparison processing for outputting a digitalized first comparison result signal with respect to a voltage signal corresponding to an overflow charge overflowing from the photoelectric conversion element to the output node in the integration period and second comparison processing for outputting a digitalized second comparison result signal with respect to a voltage signal corresponding to an accumulated charge of the photoelectric conversion element transferred to the output node in the transfer period after the integration period.

25. A method for driving a solid-state imaging device according to claim 24, wherein:

each pixel includes a memory part for storing data corresponding to the comparison result signal of the comparator, the method comprises, when reading out the pixel signal of the pixel, performing under the control of the reading part by the comparator first comparison processing for outputting a digitalized first comparison result signal with respect to a voltage signal corresponding to an overflow charge overflowing from the photoelectric conversion element to the output node in the integration period and second comparison processing for outputting a digitalized second comparison result signal with respect to a voltage signal corresponding to a accumulated charge of the photoelectric conversion element transferred to the output node in the transfer period after the integration period, and, the method controls whether to write data corresponding to the second comparison result signal of the second comparison processing into the memory part in accordance with a state of the first comparison result signal of the first comparison processing and controls access to the memory part in accordance with a state of the comparison result signal of the comparator.

26. An electronic apparatus, comprising a solid-state imaging device and an optical system for forming a subject image in the solid-state imaging device, wherein the solid-state imaging device includes a pixel part in which pixels for performing photoelectric conversion are arranged and a reading part which reads out pixel signals from the pixels in the pixel part, wherein each pixel includes a photoelectric conversion element which accumulates a charge generated by photoelectric conversion in an integration period, a transfer element capable of transferring the charge accumulated in the photoelectric conversion element in a transfer period after the integration period, an output node to which the charge accumulated in the photoelectric conversion element is transferred through the transfer element, an output buffer part which converts the charge at the output node to a voltage signal corresponding to a quantity of the charge and outputs the converted voltage signal, and a comparator which performs comparison processing comparing the voltage signal of the output buffer part and a reference voltage and outputting a digitalized comparison result signal and wherein the comparator, under the control of the reading part, performs first comparison processing for outputting a digitalized first comparison result signal with respect to a voltage signal corresponding to an overflow charge overflowing from the photoelectric conversion element to the output node in the integration period and second comparison processing for outputting a digitalized second comparison result signal with respect to a voltage signal corresponding to an accumulated charge of the photoelectric conversion element transferred to the output node in the transfer period after the integration period.

27. An electronic apparatus as set forth in claim 26, wherein: each pixel includes a memory part capable of storing data corresponding to the comparison result signal of the comparator and a memory control part for controlling access to the memory part in accordance with a state of the comparison result signal of the comparator, the comparator, under the control of the reading part, can perform first comparison processing for outputting a digitalized first comparison result signal with respect to a voltage signal corresponding to an overflow charge overflowing from the photoelectric conversion element to the output node in the integration period and second comparison processing for outputting a digitalized second comparison result signal with respect to a voltage signal corresponding to an accumulated charge of the photoelectric conversion element transferred to the output node in the transfer period after the integration period, and the memory control part controls whether to write data corresponding to the second comparison result signal of the second comparison processing into the memory part in accordance with a state of the first comparison result signal of the first comparison processing.

* * * * *